United States Patent
Gendron-Hansen et al.

(10) Patent No.: US 12,224,343 B2
(45) Date of Patent: Feb. 11, 2025

(54) POWER DEVICE WITH PARTITIONED ACTIVE REGIONS

(71) Applicant: Analog Power Conversion LLC, Bend, OR (US)

(72) Inventors: Amaury Gendron-Hansen, Bend, OR (US); Dumitru Gheorge Sdrulla, Bend, OR (US); Leslie Louis Szepesi, Bend, OR (US)

(73) Assignee: Analog Power Conversion LLC, Bend, OR (US)

( * ) Notice: Subject to any disclaimer, the term of this patent is extended or adjusted under 35 U.S.C. 154(b) by 478 days.

(21) Appl. No.: 17/374,706

(22) Filed: Jul. 13, 2021

(65) Prior Publication Data
US 2023/0012738 A1    Jan. 19, 2023

(51) Int. Cl.
*H01L 29/78*    (2006.01)
*H01L 27/088*    (2006.01)
(Continued)

(52) U.S. Cl.
CPC ...... *H01L 29/7827* (2013.01); *H01L 27/0886* (2013.01); *H01L 29/47* (2013.01); *H01L 29/4916* (2013.01); *H01L 29/78684* (2013.01)

(58) Field of Classification Search
CPC ............. H01L 29/1058; H01L 29/1066; H01L 29/66893–66924; H01L 29/8086; H01L 2924/13062; H01L 27/098; H01L 27/14679; H01L 29/04–045; H01L 29/16–1608; H01L 29/18–185; H01L 29/22–2206; H01L 29/36–365; H01L 29/122; H01L 29/2003; H01L 21/02389; H01L 29/66666; H01L 29/7827; H01L 29/152; H01L 29/0649; H01L 29/401; H01L 29/0676; H01L 29/66356; H01L 29/7391; H01L 29/205; H01L 29/7848; H01L 27/2454; H01L 21/823487; H01L 21/823885; H01L 21/82285;
(Continued)

(56) References Cited

U.S. PATENT DOCUMENTS

2005/0184339 A1    8/2005  Allen et al.
2007/0075364 A1    4/2007  Sin et al.
(Continued)

FOREIGN PATENT DOCUMENTS

KR    20200069924 A    6/2020

OTHER PUBLICATIONS

International Search Report and Written Opinion dated Oct. 25, 2022 for International Application No. PCT/US2022/035969.

*Primary Examiner* — Moin M Rahman

(57) ABSTRACT

A semiconductor device includes a substrate, and a plurality of active regions disposed over the substrate. The plurality of active regions have a first total area. One or more inactive regions are also disposed over the substrate. The one or more inactive regions have a second total area. The second total area is greater than or equal to 1.5 times the first total area. The active regions may be formed in an epitaxial layer formed over the substrate. A plurality of cells of an active device may be disposed in the plurality of active regions. The inactive regions may include only structures that do not dissipate substantial power when the semiconductor device is functioning as it is designed to function.

18 Claims, 12 Drawing Sheets

(51) Int. Cl.
*H01L 29/47* (2006.01)
*H01L 29/49* (2006.01)
*H01L 29/786* (2006.01)

(58) Field of Classification Search
CPC ............. H01L 27/0821; H01L 27/0828; H01L 27/10864; H01L 27/10876; H01L 29/66272; H01L 29/66674; H01L 29/66712; H01L 29/732; H01L 29/7327; H01L 29/7371; H01L 29/7395; H01L 29/7788; H01L 29/78642; H01L 29/7889; H01L 29/7926; H01L 29/8083; H01L 29/812; H01L 27/092–0928; H01L 29/045; H01L 29/0657; H01L 21/02639; H01L 29/1041; B82Y 10/00; B81C 2203/0728; B81C 2203/0735; B81C 2203/0742

See application file for complete search history.

(56) References Cited

U.S. PATENT DOCUMENTS

| | | | |
|---|---|---|---|
| 2012/0168840 A1* | 7/2012 | Willemsen | H01L 27/0207 257/296 |
| 2014/0246751 A1 | 9/2014 | Cheng | |
| 2015/0008442 A1 | 1/2015 | Zhou et al. | |
| 2015/0372086 A1* | 12/2015 | Fachmann | H01L 29/4232 257/329 |
| 2017/0330964 A1* | 11/2017 | Siemieniec | H01L 29/4238 |
| 2021/0111245 A1* | 4/2021 | Kosugi | H01L 29/1608 |

* cited by examiner

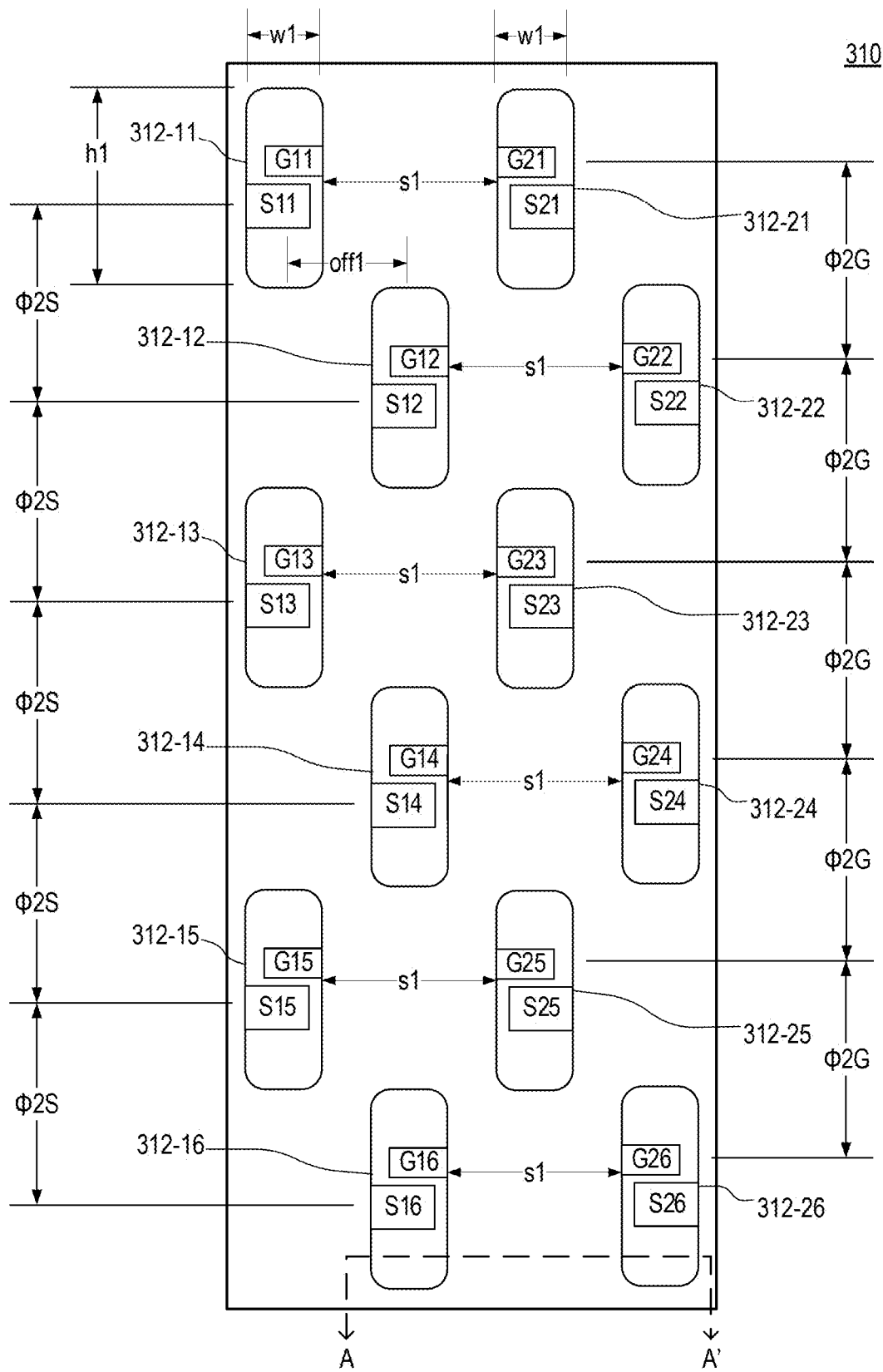

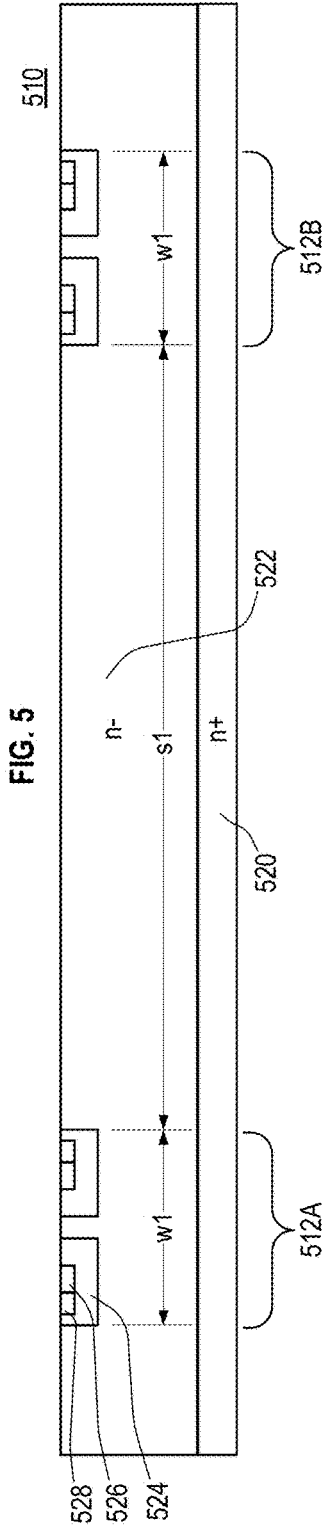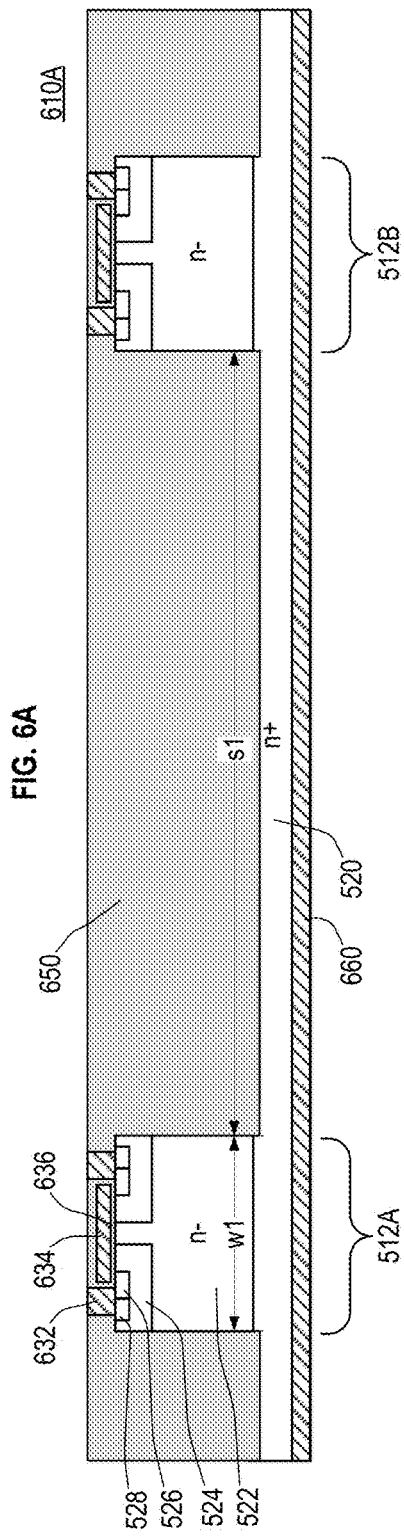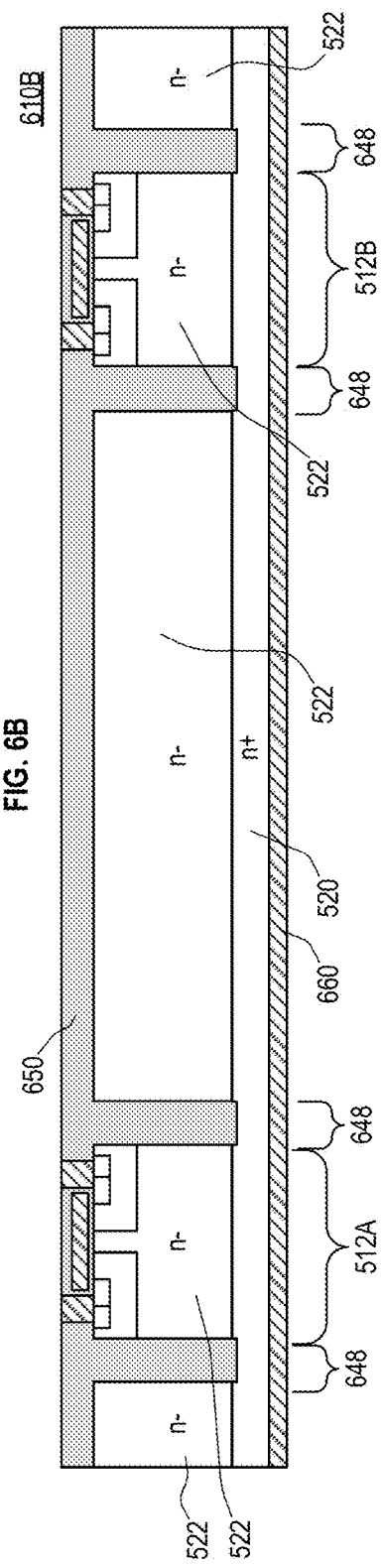

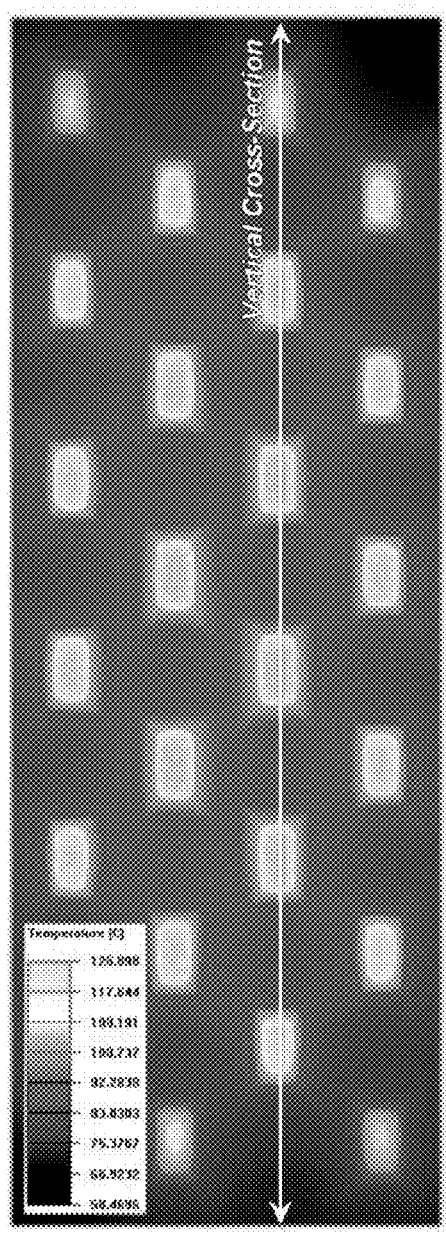
FIG. 14A
FIG. 14B
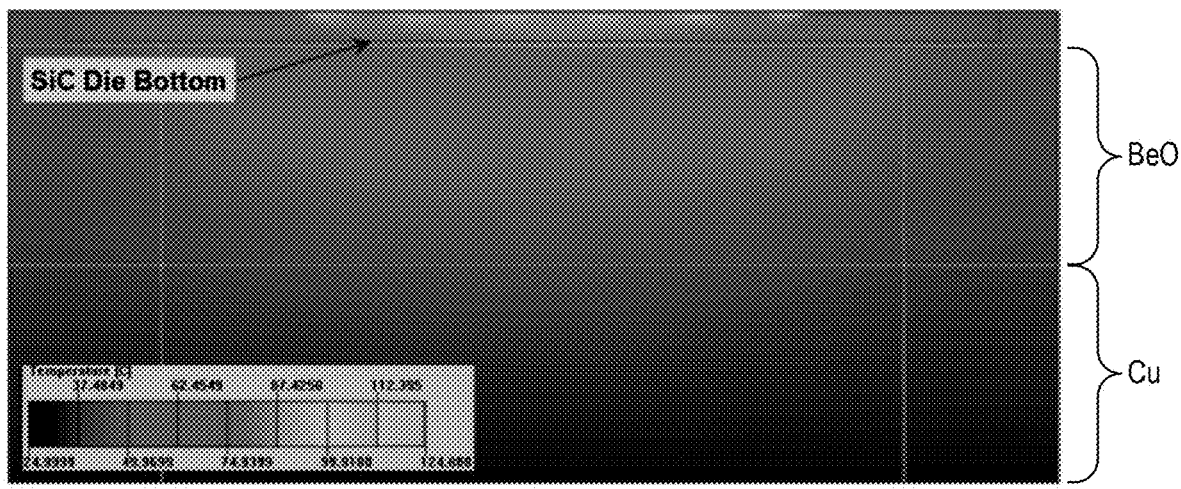

POWER DEVICE WITH PARTITIONED ACTIVE REGIONS

BACKGROUND

A semiconductor power device may be composed of a plurality of cells. For example, a silicon carbide (SiC) Vertical Metal-Oxide-Semiconductor Field Effect Transistor (VMOSFET) may include a plurality of cells each including its own gate conductor and associated gate pad, source region(s) and associated source pad(s), and drain contact, which in vertical device such as a VMOSFET may be disposed over a surface of the die opposite the surface over which the gate and source pads are disposed.

A Safe Operating Area (SOA) of such a power device may be limited on the high-current high-voltage side by thermal instability triggered by the negative temperature coefficient of the threshold voltage $V_{th}$ of the cells. Both the bias conditions and the die temperature of the cells play a role in the thermal instability of the cell.

Non-uniformity of the turn on voltage from cell to cell may cause one or several cells to "steal" most if not all the drain current. Due to the negative temperature coefficient of the threshold voltage $V_{th}$, the cells with increased current will have an even lower threshold voltage $V_{th}$ and will start conducting even more current. This produces a local self-heating phenomenon that may result in permanent damage of those cells.

Area on a semiconductor die has been called "the most expensive real estate in the world." Accordingly, economic factors may drive high packing density of cells of a power device. Furthermore, a high packing density of the cells promotes uniform characteristics in the conductors used to connect the gates of the cell to the one or more drivers that control the device by, for example, minimizing the differences in the length of bond wires connected to the gate, and therefor minimizing the differences between the respective parasitic inductances of the bond wires.

However, a high packing density of the cells of a power device may aggravate the conditions that initiate thermal instability.

Furthermore, inductances associated with control signals provided to inputs of a MOSFET and the input capacitance of the MOSFET may cause large over- and under-voltages that may exceed a rupture voltage of the gate oxide of the MOSFET, causing reliability concerns. This may limit the power capacity and maximum operation frequency of power modules using wide band-gap devices such as SiC MOSFETs and Gallium Nitride (GaN) FETs.

SUMMARY OF THE INVENTION

Embodiments relate to semiconductor devices, and in particular to silicon carbide (SiC) power devices having compact active regions spaced far apart from each other. Embodiments include SiC devices for high-power applications, such as VMOSFETs. Such devices may operate in industrial, scientific, and medical (ISM) radio frequency (RF) bands, including but not limited to the 6.78, 13.56, 27.12, and 40.68 MHz ISM bands. Embodiments operate to increase maximum power dissipation of a semiconductor device without degrading the RF performance of the device.

In an embodiment, a semiconductor device comprises a substrate, a plurality of active regions, and one or more inactive regions. The plurality of active regions have a first total area, and the one or more inactive regions have a second total area. The second total area is greater than or equal to 1.5 times the first total area.

The active regions may be formed in an epitaxial layer (an epitaxy) formed (typically, grown) over the substrate.

A plurality of cells of an active device may be disposed in the plurality of active regions.

The one or more inactive regions are disposed between respective pairs of the active regions.

BRIEF DESCRIPTION OF THE DRAWINGS

FIGS. 3A and 3B illustrates the layout of a VMOSFET power device according to an embodiment.

FIG. 5 illustrates a cross-section of a partially-formed VMOSFET power device according to embodiments.

FIG. 6A illustrates a cross-section of the VMOSFET power device of FIG. 5 with additional processing according to an embodiment.

FIG. 6B illustrates a cross-section of the VMOSFET power device of FIG. 5 with additional processing according to another embodiment.

FIG. 14A illustrates a surface temperature map of a VMOSFET power device according to an embodiment.

FIG. 14B illustrates a cross-sectional temperature map of a VMOSFET power device according to an embodiment.

DETAILED DESCRIPTION

Figure 1:
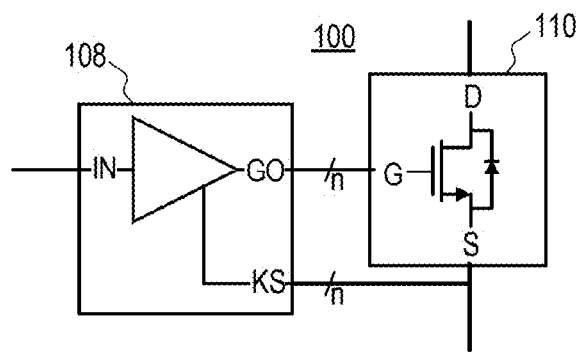
FIG. 1 illustrates a circuit including a driver and a transistor according to an embodiment.

Embodiments of the present application relate to sparse layouts of active regions containing cells of a semiconductor power device, and in particular to sparse layouts of active regions containing cells of a power device such as a silicon carbide (SiC) Vertical Metal-Oxide-Semiconductor Field Effect Transistor (VMOSFET) or a SiC Vertical Insulated Gate Bipolar Transistor (V-IGBT). Embodiments further relate to driver devices configured to drive the power device having a sparse layouts of active regions.

Although embodiments presented herein may be described with respect to silicon carbide (SiC) technology, embodiments are not limited thereto, an in other embodiments, other wide bandgap (WBG) or ultra-wide bandgap (UWGB) technology may be used instead, such as gallium nitride (GaN), aluminum gallium nitride (AlGaN), high aluminum content AlGaN, beta gallium trioxide ($\beta\text{-}Ga_2O_3$), diamond, boron nitrides, and the like. For example, embodiments may use GaN instead of SiC. Other embodiments may use a polytype of SiC other than 4H, such as 3C-SiC.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Embodiments herein are described that include a SiC n-channel VMOSFET, but embodiments are not limited thereto. For example, embodiments may instead include a planar MOSFET, a planar or vertical IGBT, a p-channel device, a PIN diode, a planar or vertical Schottky barrier diode (SBD), a bipolar junction transistor (BJT), a thyristor, a gate turn-off thyristor (GTO), or combinations thereof.

An RF power device should be able to dissipate a large amount of power and should therefore have a low thermal resistance so that heat can easily flow out of the device. The device should also provide a high conversion efficiency, and accordingly should have low input, output, and reverse capacitances. These requirements respectively translate to a large die size and a low active area, where the active area is the sum of the areas of the active regions of the device. In commercial MOSFETs of the related art, the die size and active area are closely linked and cannot be tuned independently from each other.

Embodiments form a semiconductor power device by forming a plurality of cells of the power device in a plurality of widely-separated active regions. For example, an embodiment may include a SiC n-channel VMOSFET with integrated diode comprised of a plurality of cells in respective active regions, wherein each cell includes a respective SiC n-channel VMOSFET and integrated diode, wherein the area occupied by the active regions is less than the area of the inactive regions of the die, and wherein the active regions are spaced apart. For example, the active regions may occupy 40% or less of the total die area of the power device, with the inactive regions occupying the remainder of the die.

As used herein, active and inactive regions are generally differentiated by the generation of heat. Accordingly, the active regions of a semiconductor device may be defined as the regions near the surface or in specific volumes in which substantial power is dissipated under normal conditions of operation. The specific volumes may extend throughout the entire thickness of the die but not across the entire surface of a die. The active regions therefore appear on a thermal scan (as with an infrared camera) as regions with higher temperature than their surroundings during normal operation of the device, and temperatures above ambient in the inactive regions usually result only because of diffusion of heat out of the active regions into the inactive regions.

The active regions may also be defined as the regions (volumes) of the die which performs the function required (designed) for a specific application of the semiconductor device. As a non-limiting example, the function of a power semiconductor may be to control a current by switching between off (no electric current conduction) and on (substantial electric current conduction) states, and the active regions of that power semiconductor would be the regions that perform that switching.

In some devices, such as high-voltage power semiconductor devices, the active regions may be bounded by high-voltage termination structures. In such a device, the active regions would be those regions disposed within respective high-voltage termination structures, and the inactive regions would be those regions of the device not within a respective high-voltage termination structures.

Furthermore, as the functionality of most semiconductors devices is determined by, among other things, the doping of the semiconductor, the active regions of a semiconductor device will have highly-doped regions of various polarities inside them (typically with dopant concentrations of $1.0E17$ $cm^{-3}$ or higher for SiC technology), while the inactive regions include only low-doped epitaxy (typically with dopant concentrations of $2.0E16$ $cm^{-3}$ and lower for SiC technology) and/or dielectric regions. In some devices, the inactive regions may leave the starting material in its original state, with no additional doping. For example, when the semiconductor device is formed by growing a lightly doped n-type semiconductor to form an epitaxy on a substrate comprising a heavily doped n-type semiconductor, the portions of the epitaxy and substrate in the inactive regions of the completed device may have the dopant concentration present when the formation of the epitaxy was complete.

Respective control pads (for example, gate pads) may be provided for each active region. In embodiments, one or more pads for a conduction terminal of a first type (for example, one or more source pads) may be provided for each active region. Conduction terminals of a second type (for example, a drain) may be electrically coupled together to a single pad, such as a drain pad. When the device is a vertical device, the pads for the control terminals and the conduction terminals of the first type may be formed over one face (e.g., the top) of the die, and the pad for the conduction terminals of the second type may be formed over an opposite face (e.g. the bottom) of the die.

By spacing apart the active regions, embodiments may produce a more uniform temperature over a surface of the die used to dissipate heat, and may therefore improve the ability of the die to dissipate heat. Embodiments may also improve the specific series resistance of a vertical device by spreading the current passing through the device in a substrate of the device. Embodiments may improve the yield of the device by redundancy of the active regions because which active regions are used may be determined by which ones are connected to a driver device, and because imperfections outside the active regions do not affect the functionality of the device.

The spacing apart of the active regions may cause the control pads and conduction terminal pads to be spaced apart. In order to reduce a parasitic inductance and variations in the parasitic inductance of connections to the spaced-apart control pads and conduction terminal pads, a driver device configured according to the dimensional properties of the semiconductor device controlled by the driver device (such as a number of pads and a layout pitch of the pads) may be used in an embodiment. For example, the layout of the pads for a plurality of gate control signals and a plurality of corresponding Kelvin source connections of a driver device may be matched to the layout of a plurality of gate pads and a plurality of source pads of a power semiconductor device to enable low inductance, low resistance connections between the driver device to the power semiconductor device.

FIG. 1 illustrates a circuit 100 according to an embodiment. The circuit 100 includes a driver device 108 and a transistor 110. In FIG. 1, the driver device 108 is a non-inverting driver and the transistor 110 is a MOSFET, such as a SiC power VMOSFET, but embodiments are not limited thereto.

The driver device 108 includes an input IN, one or more gate outputs GO, and one or more Kelvin source connections KS. The Kelvin source connections KS provide a direct low-inductance return paths for current flowing between the gate outputs GO of the driver device 108 and control terminal capacitances (such as a gate-source capacitances) of a device being driven by the gate outputs GO. For example, when the driver device 108 produces the one or more gate outputs GO on respective drain terminals of one or more MOSFETs and the device being driven by the gate outputs GO is a VMOSFET, the Kelvin source connection KS may electrically couple the respective source terminals of those MOSFETs in the driver device 108 to respective sources terminal of that VMOSFET.

The transistor 110 includes one or more gate pads G, one or more source pads S, and one or more drain contacts D. In an embodiment, such as a SiC power VMOSFET, each cell of the transistor 110 includes a gate pad for the cell's gate and a source pad for the cell's source, but the drains of all the cells are connected to a single common drain contact.

In an embodiment of the circuit 100 of FIG. 1, the transistor 110 includes N cells each with its own gate and drain contacts, and the driver device 108 includes N gate outputs GO respectively paired to N Kelvin source connections, where N is an integer greater than or equal to 2. Each gate output GO is connected to a respective gate pad G, and the corresponding Kelvin source connection for that gate output GO is connected to the source pad S corresponding to that gate pad G, and the source pads S of the cells are also connected (by conductors other than those used for the Kelvin source connections) to a common source lead or pad. In an embodiment, N is greater than or equal to 8. In embodiments, the N cells may include only properly functioning cells of the transistor 110, and defective cells of the transistor 110 may be left unconnected.

In another embodiment of the circuit 100 of FIG. 1, the transistor 110 includes 2×N cells each with a gate pad and drain contact, and the driver device 108 includes N gate outputs GO respectively paired to at least N Kelvin source connections, where N is a an integer greater than or equal to 2. Each gate output GO is connected to a respective pair of gate pads G, and the source pad S corresponding to those gate pads G are connected to a Kelvin source connection corresponding to gate output GO, and all of the source pads S are also connected to a common source lead or pad. In an embodiment, N is greater than or equal to 4.

In another embodiment of the circuit 100 of FIG. 1, the transistor 110 includes 2×N cells arranged within first and second halves of the transistor 110, each cell having its own gate pad and drain contact, where N is a an integer greater than or equal to 2. The first and second halves of the transistor 110 may be disposed on opposite sides of a centerline of the transistor 110. The driver device 108 is comprised of first and second driver devices each including N gate outputs GO respectively paired to N Kelvin source connections. Each gate output GO of the first driver device is connected to a gate pad G of a cell within the first half of the transistor 110, and the source pad S corresponding to that gate pad G is connected to the Kelvin source connection corresponding to that gate output GO. Each gate output GO of the second driver device is connected to a gate pad G of a cell within the second half of the transistor 110, and the source pad S corresponding to that gate pad G is connected to the Kelvin source connection corresponding to that gate output GO. All of the source pads S are also connected to a common source lead or pad, and the inputs IN to the first and second driver devices may be electrically coupled together. In an embodiment, N is greater than or equal to 4.

In each of the embodiments described above, the gate pads G of the transistor 110 may be connected to a physically-nearest gate output GO of the driver device(s), and the source pads S of the transistor 110 may be connected to a physically-nearest Kelvin source connection KS of the driver device(s). In this manner, a parasitic inductance encountered by the currents driving the gates of the cells of the transistor 110 may be minimized. To do this, the area enclosed by currents passing from each gate output GO to the transistor 110 and then back to the Kelvin source connection KS should be made as small as possible. In this manner, differences between the respective parasitic inductances encountered by those currents may be reduced, so that the gates may receive signals having more similar levels of damping, ringing, overshoot, etcetera.

In each of the embodiments described above, a contact pitch of the gate outputs GO and the Kelvin source connections KS of the driver device 108 may be determined according to a contact pitch of the gate pads G of the transistor 110, or the contact pitch of the gate pads G of the transistor 110 may be determined according to the contact pitch of the gate outputs GO and the Kelvin source connections KS of the driver device 108.

In an illustrative embodiment, the contact pitch of the gate outputs GO may be within 10% of the contact pitch of the corresponding gate pads G. For example, when the gate pads G are pitched to be 500 microns (μm) apart along an axis, the gate outputs GO may be spaced between 450 and 550 microns apart on that axis.

In another illustrative embodiment, the contact pitch of the gate outputs GO may be within 10% of a multiple (such as two) of the contact pitch of the corresponding gate pads G. For example, when the gate pads G are pitched to be 500 microns apart along an axis, the gate outputs GO may be spaced between 900 and 1100 microns apart on that axis; in such an embodiment, two gate pads G may be connected to each gate output GO.

Figure 2:
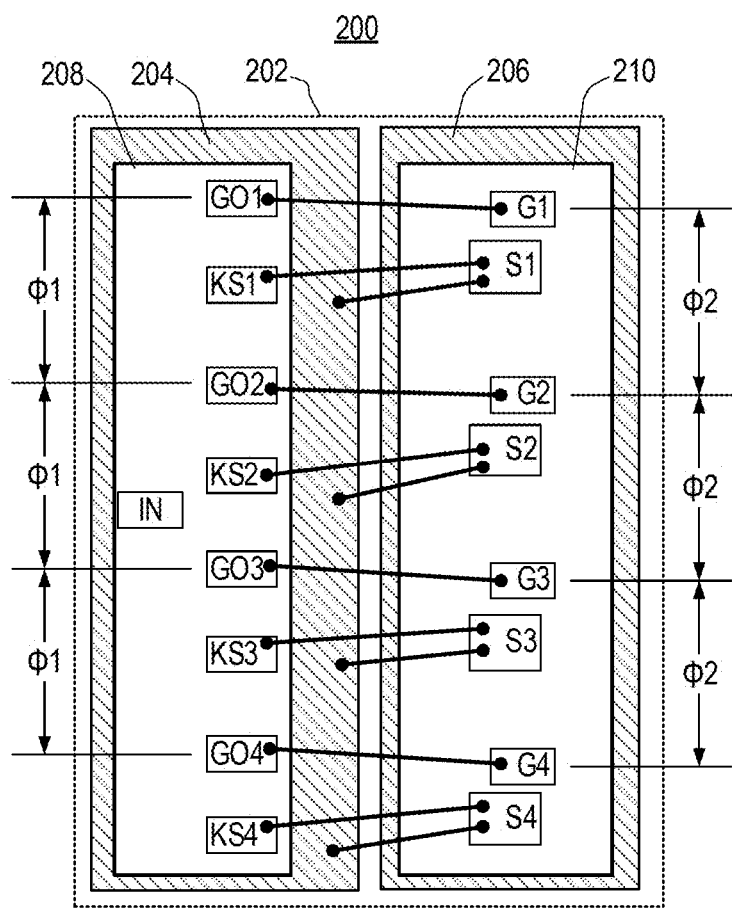
FIG. 2 illustrates a driver die coupled to a VMOSFET power device according to an embodiment.

FIG. 2 illustrates a driver device 208 coupled to a VMOSFET power device 210 according to an embodiment. The driver device 208 may correspond to the driver device 108 of FIG. 1 and the VMOSFET power device 210 may correspond to the transistor 110 of FIG. 1.

The driver device 208 and VMOSFET power device 210 are mounted on a circuit board 202. The circuit board 202 may include a layer comprising an electrically insulating material (such as beryllium oxide, BeO) and includes a source pad 204 and a drain pad 206 formed on a surface of that layer. The source pad 204 and a drain pad 206 may comprise an electrically conductive material such as copper (Cu).

The driver device 208 is mounted over the source pad 204. In embodiments, a first power supply contact (such as for VSS) on a bottom surface (not shown) of the driver device 208 may be electrically coupled to the source pad 204.

The VMOSFET power device 210 is mounted over the drain pad 206 and a drain contact of the VMOSFET power device 210 is electrically coupled to the drain pad 206.

A first gate output GO1 of the driver device 208 is electrically connected to a first gate pad G1 of the VMOSFET power device 210 using, for example, a first bond wire, and a corresponding first Kelvin source connection KS1 of the driver device 208 is electrically connected to a first source pad S1 of the VMOSFET power device 210 using, for example, a second bond wire. The first source pad S1 of the VMOSFET power device 210 is also electrically connected to the source pad 204 using, for example, a third bond wire.

Similarly, second, third, and fourth gate output GO2, GO3, and GO4 of the driver device 208 are respectively electrically connected to second, third, and fourth gate pads G2, G3, and G4 of the VMOSFET power device 210 using respective bond wires, and corresponding second, third, and fourth Kelvin source connection KS2, KS3, and KS4 of the driver device 208 are respectively electrically connected to second, third, and fourth source pad S2, S3, and S4 of the VMOSFET power device 210 using respective bond wires. The second, third, and fourth source pad S2, S3, and S4 of the VMOSFET power device 210 are also electrically connected to the source pad 204 using respective bond wires.

Figure 8:
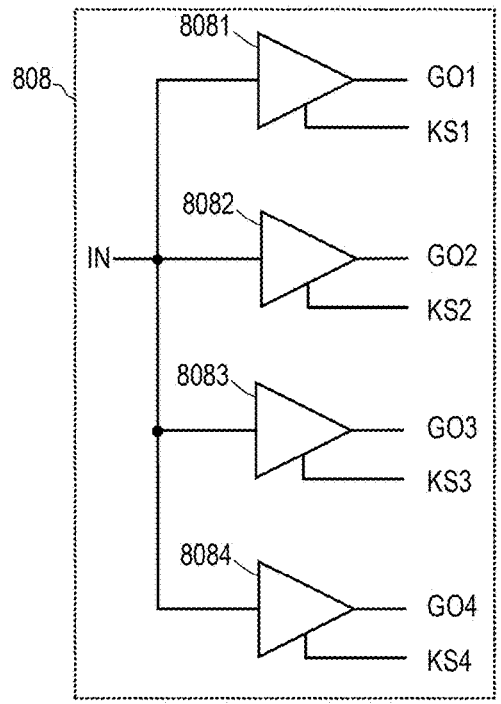
FIG. 8 illustrates a circuit corresponding to a driver according to an embodiment.

In an embodiment, the first through fourth gate outputs GO1 through GO4 and first through fourth Kelvin source connections KS1 through KS4 may correspond to first through fourth subdriver circuits of the driver device 208. Inputs of the first through fourth subdriver circuits may all be electrically coupled to an input signal, as shown in FIG. 8, or each subdriver circuits may have its own input signal.

The first gate pad G1 and the first source pad S1 may correspond to a first cell of the VMOSFET power device 210. Similarly, the second gate pad G2 and second source pad S2, the third gate pad G3 and third source pad S4, and the fourth gate pad G4 and fourth source pad S4 may respectively correspond to second, third, and fourth cells of the VMOSFET power device 210.

Not shown in the interest of clarity in FIG. 2 are a second power supply contact (such as for VDD) of the driver device 208.

A first pitch Φ1 corresponds to a spacing of the first through fourth gate outputs GO1 through GO4 of the driver device 208, and may also correspond to a spacing of the first through fourth Kelvin source connections KS1 through KS4 of the driver device 208. A second pitch Φ2 corresponds to a spacing of the first through fourth gate pads G1 through G4 of the VMOSFET power device 210, and may also correspond to a spacing of the first through fourth source pads S1 through S4 of the VMOSFET power device 210.

When the first pitch Φ1 is identical to or substantially similar to the second pitch Φ2, respective connections between the gate outputs and Kelvin source pads of the driver device 208 and the gate pads and source pads of the VMOSFET power device 210 are physically similar to each other, and are therefore electrically similar to each other. Also, the first pitch Φ1 being identical to or substantially similar to the second pitch Φ2 may facilitate minizine the length of the bond wires forming the connections. In an embodiment, "substantially similar" may mean within 10% or 20%. In another embodiment, "substantially similar" may mean that none of the gate outputs of the driver device 208 are misaligned from the gate pad of VMOSFET power device 210 to which it will be connected by more than a fraction (such as ½) of the second pitch Φ2.

FIG. 3A illustrates a layout of a VMOSFET power device 310 according to an embodiment. The VMOSFET power device 310 may correspond to the transistor 110 of FIG. 1 or the MOSFET power device 210 of FIG. 2. In embodiments, the VMOSFET power device 310 is a SiC VMOSFET power device fabricated using SiC having a 4H polytype (4H-SiC).

Fabricating the device using 4H-SiC leverages the high thermal conductivity (relative to other semiconductors such as silicon or GaN) and volumetric heat capacity of 4H-SiC. For example, 4H-SiC may have over twice or over three times the thermal conductivity (depending on the orientation of heat flow relative to the crystal lattice) than silicon, and may have 30% higher volumetric heat capacity that silicon. Accordingly, a device fabricated using 4H-SiC may be smaller than a silicon device having the same power dissipation capability.

The VMOSFET power device 310 includes twelve active region arranged in six rows, with adjacent rows offset from each other. A first row includes first left and right active regions 312-11 and 312-21, a second row includes second left and right active regions 312-12 and 312-22, a third row includes third left and right active regions 312-13 and 312-23, a fourth row includes fourth left and right active regions 312-14 and 312-24, a fifth row includes fifth left and right active regions 312-15 and 312-25, and a sixth row includes sixth left and right active regions 312-16 and 312-26.

In an embodiment, the regions of the VMOSFET power device 310 outside the first through sixth left active regions 312-11 through 312-16 and the first through sixth right active regions 312-21 through 312-26 (that is, in the inactive regions) comprise only epitaxial semiconductor material (for example, lightly-doped n-type SiC), insulating materials (for example, silicon dioxide ($SiO_2$)), or a combination thereof. In another embodiment, the inactive regions may also include structures and devices that do not dissipate power; that is, that generate no or an insubstantial amount of heat.

Each active region may correspond to a cell, and may include a gate pad and one or more source pads. First, second, third, fourth, fifth, and sixth left gate pads G11, G12, G13, G14, G15, and G16 are respectively coupled to gate electrodes of the cells of the first, second, third, fourth, fifth, and sixth left active regions 312-11, 312-12, 312-13, 312-14, 312-15, and 312-16 by respective on-die conductors (not shown). First, second, third, fourth, fifth, and sixth left source pads S11, S12, S13, S14, S15, and S16 are respectively coupled to source electrodes of the cells of the first, second, third, fourth, fifth, and sixth left active regions 312-11, 312-12, 312-13, 312-14, 312-15, and 312-16 by respective on-die conductors (not shown). The first through sixth gate pads G11 through G16 and the first through sixth source pads S11 through S16 are illustrated as being formed over active regions of the VMOSFET power device 310, but embodiments are not limited thereto.

First, second, third, fourth, fifth, and sixth right gate pads G21, G22, G23, G24, G25, and G26 are respectively coupled to gate electrodes of the cells of the first, second, third, fourth, fifth, and sixth right active regions 312-21, 312-22, 312-23, 312-24, 312-25, and 312-26 by respective on-die conductors (not shown). First, second, third, fourth, fifth, and sixth right source pads S21, S22, S23, S24, S25, and S26 are respectively coupled to source electrodes of the cells of the first, second, third, fourth, fifth, and sixth right active regions 312-21, 312-22, 312-23, 312-24, 312-25, and 312-26 by respective on-die conductors (not shown). The first through sixth gate pads G21 through G26 and the first through sixth source pads S21 through S26 are illustrated as being formed over active regions of the VMOSFET power device 310, but embodiments are not limited thereto.

Each active region may have a width w1 along the row direction and a height h1 orthogonal to the row direction. The height h1 may be three or less times the width w1.

Figure 12A:
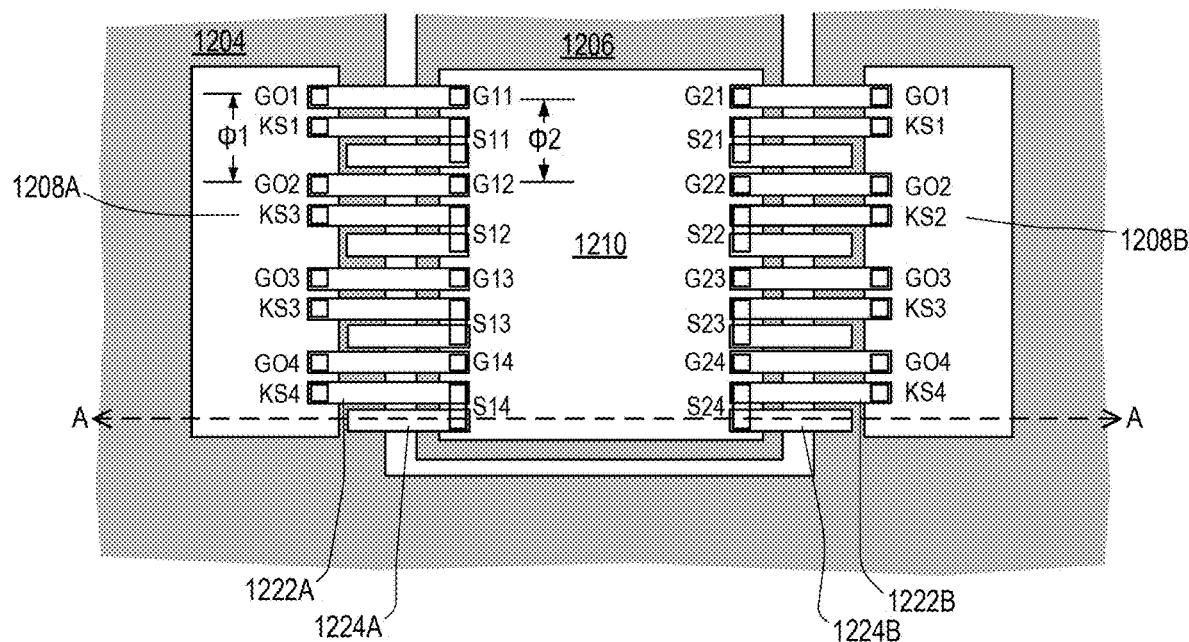
FIG. 12A illustrates a plan view of a circuit including two driver devices coupled to a VMOSFET power device according to an embodiment.

While some embodiments illustrated herein show gate and source pads disposed over their respective active regions, embodiments are not limited thereto. For example, in an embodiment having gate and source pads disposed along edges of the device, such as shown in FIG. 12A, below, the active regions may be disposed on the device as shown in FIG. 3A, and on-device wiring may be used to electrically couple the appropriate electrodes in the active regions to the gate and source pads.

The active regions in each row may be horizontally separated by a spacing s1. The active regions in adjacent rows may be horizontally separated by an offset off1 measured between a horizontal center of an active region in one row and a horizontal center of an active region in an adjacent row. The offset off1 may be equal to one-half the sum of the width w1 and spacing s1.

The gate pads of active regions in adjacent rows may be vertically spaced according to gate pitch Φ2G. The source pads of active regions in adjacent rows may be vertically spaced according to source pitch Φ2S. In an embodiment, the gate pitch Φ2G is equal to the source pitch Φ2S. Although FIG. 3A shows the gate pitch Φ2G only for the right active regions 312-21 through 312-26, and shows the source pitch Φ2S only for the left active regions 312-11 through 312-16, the gate pitch Φ2G also applies to the left active regions 312-11 through 312-16, and the source pitch Φ2S also applies to the right active regions 312-21 through 312-26

In an embodiment, the gate pitch Φ2G, the source pitch Φ2S, or both are equal to the height h1 of each of the active regions. In such an embodiment, the vertical separation between adjacent rows may be zero.

In another embodiment, the gate pitch Φ2G, the source pitch Φ2S, or both are greater than the height h1 of each of the active regions. In such an embodiment, the vertical separation between adjacent rows may be equal to the difference between the height h1 of each of the active regions and the gate pitch Φ2G or source pitch Φ2S.

In another embodiment, the gate pitch Φ2G, the source pitch Φ2S, or both are less than the height h1 of each of the active regions. In such an embodiment, the vertical overlap between adjacent rows may be equal to the difference between the gate pitch Φ2G or source pitch Φ2S and the height h1 of each of the active regions.

In embodiments, the spacing s1 is substantially larger than the width w1. In embodiments, the spacing s1 may be between 2× and 5× the width w1. By spacing out the active regions in this manner, improved thermal performance of the VMOSFET power device 310 may be achieved.

Figure 3B:
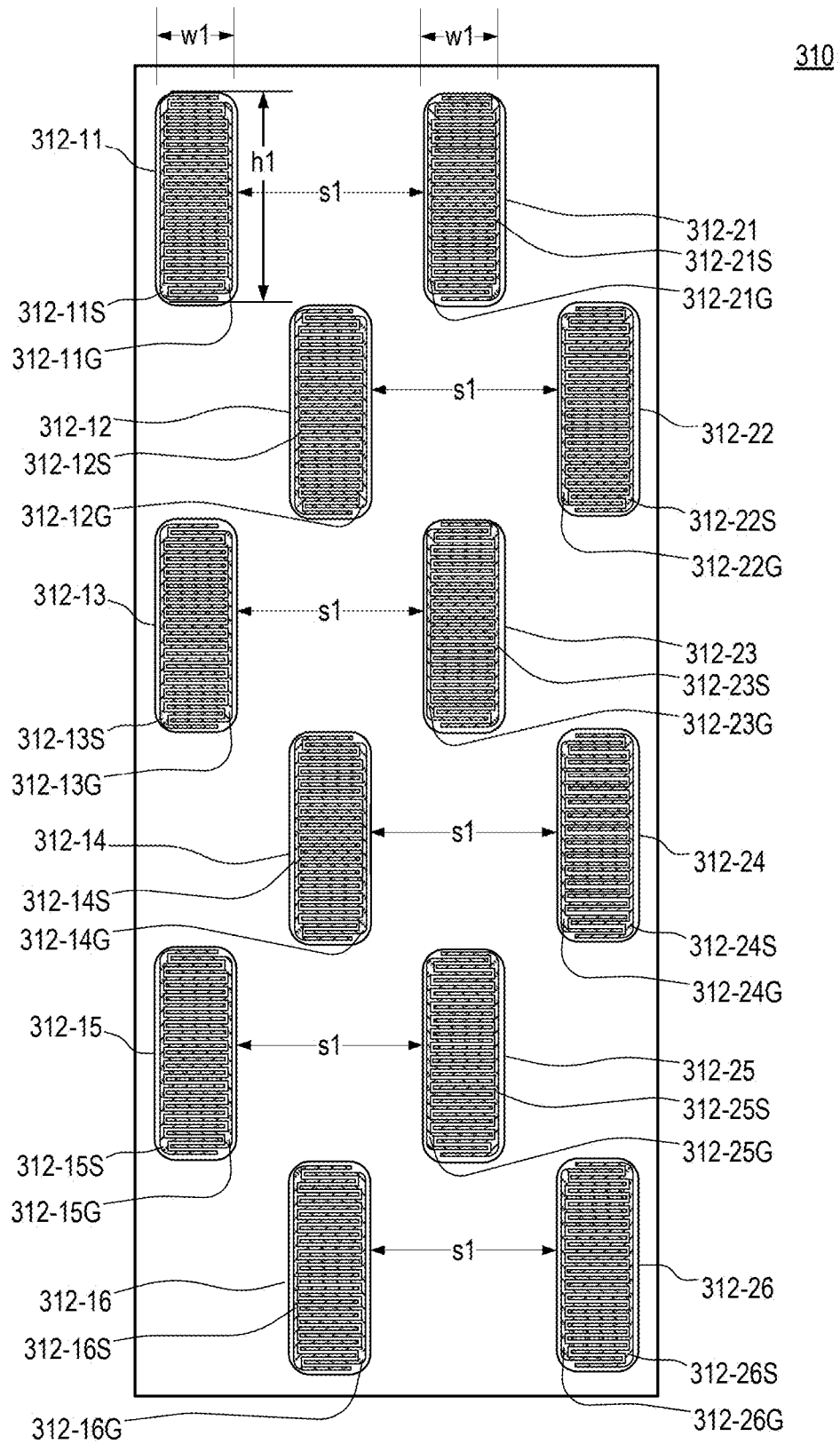

FIG. 3B illustrates details of the VMOSFET power device 310 according to an embodiment, showing gate and source electrodes of the VMOSFET power device 310.

The first, second, third, fourth, fifth, and sixth left active regions 312-11, 312-12, 312-13, 312-14, 312-15, and 312-16 respectively include first, second, third, fourth, fifth, and sixth left gate electrodes 312-11G, 312-12G, 312-13G, 312-14G, 312-15G, and 312-16G and first, second, third, fourth, fifth, and sixth left source electrodes 312-11S, 312-12S, 312-13S, 312-15S, and 312-16S.

The first, second, third, fourth, fifth, and sixth right active regions 312-21, 312-22, 312-23, 312-24, 312-25, and 312-26 respectively include first, second, third, fourth, fifth, and sixth right gate electrodes 312-21G, 312-22G, 312-23G, 312-24G, 312-25G, and 312-26G and first, second, third, fourth, fifth, and sixth right source electrodes 312-21S, 312-22S, 312-23S, 312-24S, 312-25S, and 312-26S.

Each of the gate electrodes 312-11G through 312-26G include a plurality of fingers respectively disposed between a plurality of fingers of the corresponding one of source electrodes 312-11S through 312-26S. In the illustrated embodiment, first through sixth left source electrodes 312-11S through 312-16S are respectively disposed to the left of the corresponding first through sixth left gate electrodes 312-11G through 312-16G, and first through sixth right source electrodes 312-21S through 312-26S are respectively disposed to the right of the corresponding first through sixth right gate electrodes 312-21G through 312-26G, but embodiments are not limited thereto.

The first through sixth left gate electrodes 312-11G through 312-16G may be respectively electrically coupled to the first through sixth left gate pads G11 through G16 of FIG. 3A. The first through sixth left source electrodes 312-11S through 312-16S may be respectively electrically coupled to the first through sixth left source pads S11 through S16 of FIG. 3A. The first through sixth right gate electrodes 312-21G through 312-26G may be respectively electrically coupled to the first through sixth right gate pads G21 through G26 of FIG. 3A. The first through sixth right source electrodes 312-21S through 312-26S may be respectively electrically coupled to the first through sixth right source pads S21 through S26 of FIG. 3A.

Figure 4A:
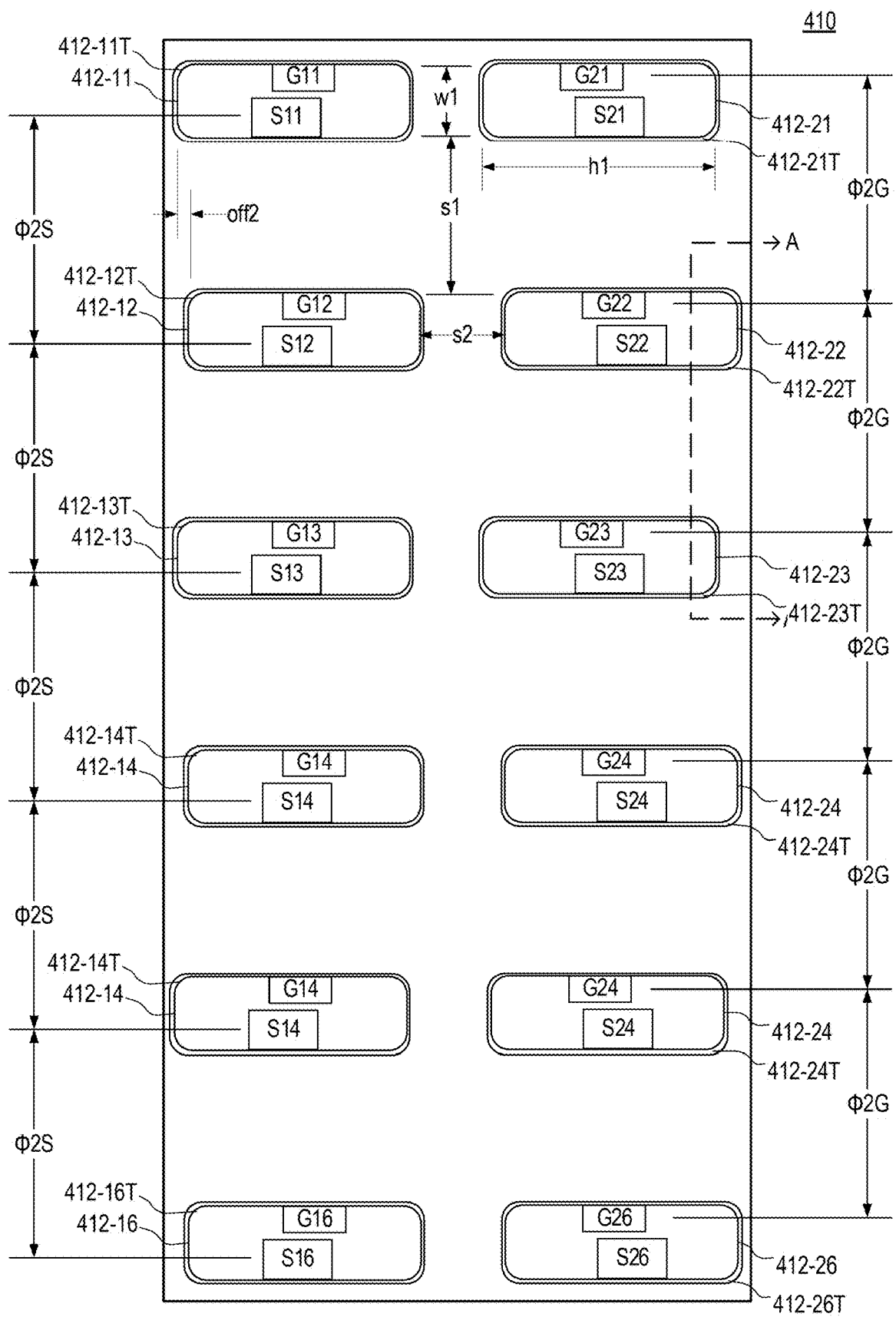
FIGS. 4A and 4B illustrates the layout of a VMOSFET power device according to another embodiment.

FIG. 4A illustrates a layout of a VMOSFET power device 410 according to another embodiment. The VMOSFET power device 410 may correspond to the transistor 110 of FIG. 1.

The VMOSFET power device 410 includes twelve active regions arranged in six rows. A first row includes first left and right active regions 412-11 and 412-21, a second row includes second left and right active regions 412-12 and 412-22, a third row includes third left and right active regions 412-13 and 412-23, a fourth row includes fourth left and right active regions 412-14 and 412-24, a fifth row includes fifth left and right active regions 412-15 and 412-25, and a sixth row includes sixth left and right active regions 412-16 and 412-26.

The first, second, third, fourth, fifth, and sixth left active regions 412-11, 412-12, 412-13, 412-14, 412-15, and 416-16 are respectively surrounded by first, second, third, fourth, fifth, and sixth left high-voltage termination structures 412-11T, 412-12T, 412-13T, 412-14T, 412-15T, and 416-16T. The first, second, third, fourth, fifth, and sixth right active regions 412-21, 412-22, 412-23, 412-24, 412-25, and 416-26 are respectively surrounded by first, second, third, fourth, fifth, and sixth right high-voltage termination structures 412-21T, 412-22T, 412-23T, 412-24T, 412-25T, and 416-26T. Each high-voltage termination structure may be formed using one or more floating field rings (FFR), a junction termination extension (JTE), a deep trench, or a combination thereof. As used in this document, a deep trench is a trench that extends from the top of the epitaxy to deeper than the metallurgical junction of the p-wells (for example, p-body 524 in FIGS. 6A and 6B) of the device. For example, in a device where the p-wells are 0.8 microns deep, a trench with a depth of 0.9 microns or more qualifies as a deep trench.

Each active region may correspond to a cell, and may include a gate pad and one or more source pads. Each active region may have a width w1 orthogonal to the row direction and a height h1 along the row direction. The height h1 may be two or more times the width w1.

The active regions in adjacent rows may be vertically (that is, in a direction orthogonal to the row direction) separated by a spacing s1. The active regions in adjacent rows may be horizontally separated by an offset off2 measured from a horizontal edge of an active region in one row and a horizontal edge of an active region in an adjacent row. In embodiments, the offset off2 may be zero.

The active regions in each row may be horizontally separated by a separation s2 measured from adjacent edges of the active regions. The separation s2 may be greater than the width w1 of each active region but substantially smaller than the height h1 of each active region.

The gate pads of active regions in adjacent rows may be vertically spaced according to the gate pitch Φ2G. The source pads of active regions in adjacent rows may be vertically spaced according to the source pitch Φ2S. In an embodiment, the gate pitch Φ2G is equal to the source pitch Φ2S. Although FIG. 4A shows the gate pitch Φ2G only for the right active regions 412-21 through 412-26, and shows the source pitch Φ2S only for the left active regions 412-11 through 412-16, the gate pitch Φ2G also applies to the left active regions 412-11 through 412-16, and the source pitch Φ2S also applies to the right active regions 412-21 through 412-26

In an embodiment, the gate pitch Φ2G, the source pitch Φ2S, or both are equal to the sum of the width w1 and the spacing s1.

In embodiments, the spacing s1 is substantially larger than the width w1, as described with respect to FIG. 3A, and accordingly thermal performance of the VMOSFET power device 410 may be improved.

Comparing the VMOSFET power device 310 of FIG. 3A to the VMOSFET power device 410 of FIG. 4A, embodiments of the VMOSFET power device 310 having a lower active region aspect ratios (that is, active regions having a shape that is closer to square) may have lower parasitic capacitances from the high-voltage termination structures (such as junction termination extensions (JTEs), floating field rings (FFR), trenches, or combinations thereof) in each active region and lower parasitic capacitances from the pad connections. On the other hand, embodiments of the VMOSFET power device 410 having higher active region aspect ratios (that is, "skinny" active regions) may have lower temperatures due to improved heat spreading, but at the expense of higher parasitic capacitances.

FIGS. 3A and 4A show the gate and source pads of each active region disposed within (usually over the top of) the respective active regions, but embodiments are not limited thereto, and in embodiments, the gate and source pads may be located outside their respective active regions, and connected to their respective regions through on-die wiring. However, in such embodiments, it is advantageous to minimizing the lengths of the on-die connections between the gate and source pads and their respective regions in order to reduce the resistance, inductance, and capacitance of those on-die connections. Accordingly, the disposition of the gate and source pads on a power device according to an embodiment may still be determined according to the disposition of the active regions within the power device, even when some or all of the gate and source pads are located outside the active regions.

Figure 4B:
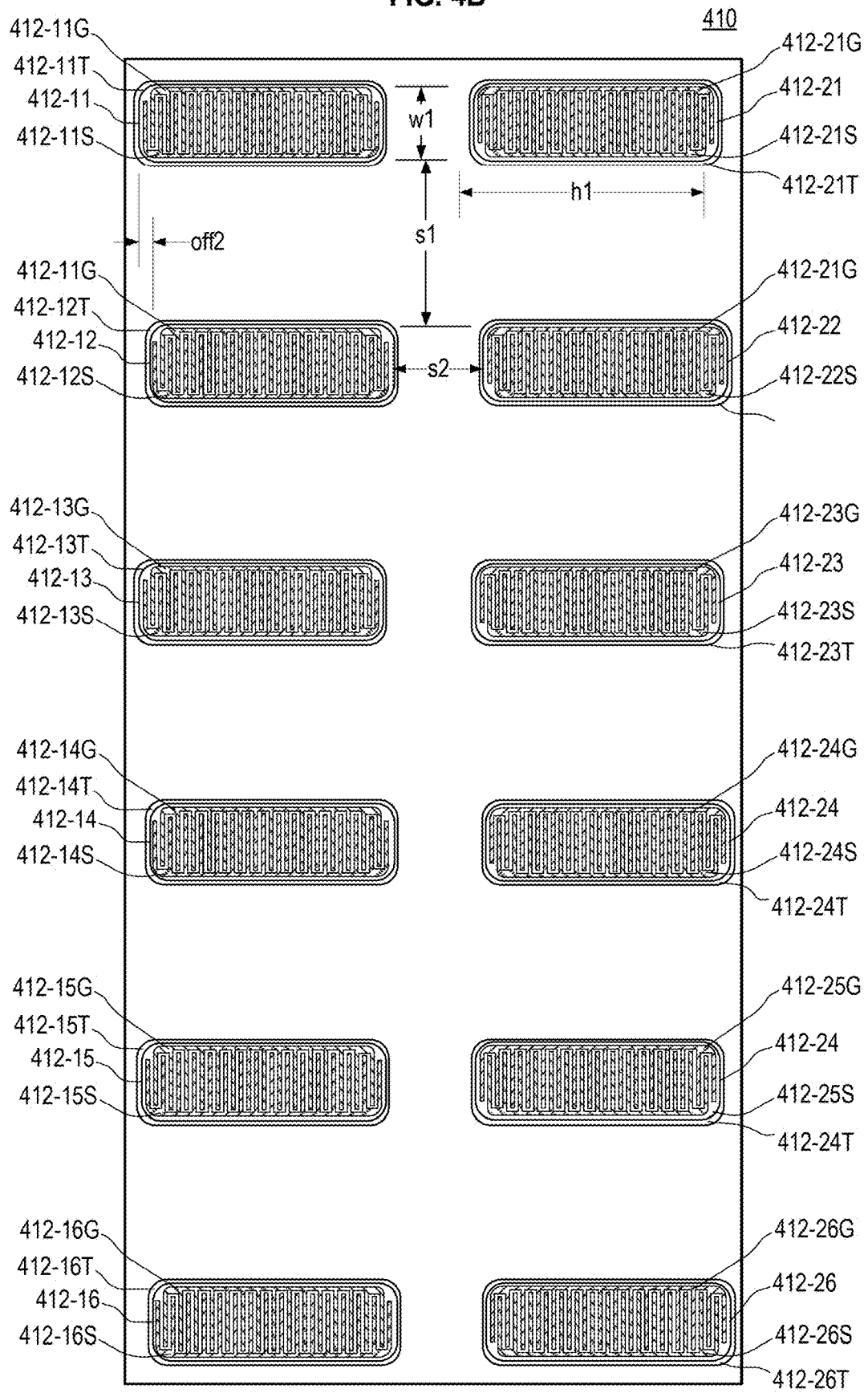

FIG. 4B illustrates details of the VMOSFET power device 410 according to an embodiment, showing gate and source electrodes of the VMOSFET power device 410.

The first, second, third, fourth, fifth, and sixth left active regions 412-11, 412-12, 412-13, 412-14, 412-15, and 412-16 respectively include first, second, third, fourth, fifth, and sixth left gate electrodes 412-11G, 412-12G, 412-13G, 412-14G, 412-15G, and 412-16G and first, second, third, fourth, fifth, and sixth left source electrodes 412-11S, 412-12S, 412-13S, 412-15S, and 412-16S.

The first, second, third, fourth, fifth, and sixth right active regions 412-21, 412-22, 412-23, 412-24, 412-25, and 412-26 respectively include first, second, third, fourth, fifth, and sixth right gate electrodes 412-21G, 412-22G, 412-23G, 412-24G, 412-25G, and 412-26G and first, second, third, fourth, fifth, and sixth right source electrodes 412-21S, 412-22S, 412-23S, 412-24S, 412-25S, and 412-26S.

The first through sixth left gate electrodes 412-11G through 412-16G may be respectively electrically coupled to the first through sixth left gate pads G11 through G16 of FIG. 4A. The first through sixth left source electrodes 412-11S through 412-16S may be respectively electrically coupled to the first through sixth left source pads S11 through S16 of FIG. 4A. The first through sixth right gate electrodes 412-21G through 412-26G may be respectively electrically coupled to the first through sixth right gate pads G21 through G26 of FIG. 4A. The first through sixth right source electrodes 412-21S through 412-26S may be respectively electrically coupled to the first through sixth right source pads S21 through S26 of FIG. 4A.

Each of the gate electrodes 412-11G through 412-26G include a plurality of fingers respectively disposed between a plurality of fingers of the corresponding one of source electrodes 412-11S through 412-26S.

The apparent dimensions of the electrodes shown in FIGS. 3B and 4B are merely to demonstrate the concept of a transistor having electrodes including a plurality of fingers, and are not to scale. Furthermore, embodiments are not limited to illustrated aspect ratios of the active regions. In transistors of the related art, in order to reduce the equivalent series resistance, the fingers may be made relatively short compared to embodiments of the present disclosure, resulting in a long, narrow active regions. In embodiments of the present disclosure, the active regions may have a smaller length-to-width ratio than active regions of transistors of the related art.

In the embodiments shown in FIGS. 3A-4B, the dimensions shown, such as the spacing s1, the separation s2, the width w1, the height h1, the offset off1, the offset off2, and the gate and source pitches Φ2G and Φ2S, may be shown as constant across the respective device, but embodiments are not limited thereto.

FIGS. 5, 6A, and 6B illustrates cross-sections of a partially-formed semiconductor power device according to embodiments. The cross-section may correspond to the line A-A' in FIG. 3A. The illustrations and descriptions thereof are illustrative, and the order of depiction and description of features therein is not necessarily the order in which those features would be created in some embodiments. FIGS. 5, 6A, and 6B illustrate a vertical power device wherein current flows from the top to the bottom of the cross-section, but embodiments are not limited thereof.

FIG. 5 illustrates a simplified cross-section of a partially-formed power device 510 according to an embodiment. The illustration omits many features such as termination structures that may be implemented in various ways known in the related arts.

The power device 510 comprises a substrate 520 of n-type silicon carbide. The silicon carbide may have a 4H polytype. An epitaxial layer 522 of lightly doped n-type 4H-SiC is formed over a top surface of the substrate 520.

First and second active regions 512A and 512B are formed in the epitaxial layer 522. Each active region has a width w1 along the direction of the cross section and is separated from the active region(s) adjacent to it along the cross-section by a spacing s1.

In the embodiment shown in FIG. 5, each of the first and second active regions 512A and 512B comprises a vertical cell, but embodiments are not limited thereto.

In the embodiment shown in FIG. 5, the first and second active regions 512A and 512B are identical, but embodiments are not limited thereto.

Each vertical cell in each active region includes a pair of p-bodies 524 formed by, for example, high-temperature implantation of aluminum (Al). The p-bodies in each active region may be separated from each other by, for example, 1.5 microns.

Each p-body 524 may surround a heavily-doped n-type source region 526 and a heavily doped p-type region 528 formed adjacent to the that n-type source region 526.

FIG. 6A illustrates a cross-section of a power device 610A corresponding to the power device 510 of FIG. 5 with further processing according to an embodiment.

In the active regions 512A and 512B, a source connection via 632 may be formed over each of the p-bodies 524 and electrically connected to both the n-type source region 526 and the p-type region 528. A gate oxide 636 of, for example, silicon dioxide, may be formed between the source connection via 632. A gate electrode 634 including, for example, doped polysilicon may be formed in or on the gate oxide 636. The source connection via 632 may be electrically connected to a source pad (not shown), and the gate electrode 634 may be electrically connected to a gate pad (not shown).

In the areas outside the active regions 512A and 512B, the epitaxial layer 522 and, in embodiments, a portion of the substrate 520 may be removed, for example, by dry etching, and a oxide layer 650 may be formed between and over the active regions 512A and 512B. The active regions 512A and 512B remain on "mesas" of the substrate 520, that is, they are on portions of the substrate 520 that are raised relative to portions of the substrate 520 in the inactive regions. The oxide layer may be silicon dioxide formed by, for example, plasma deposition or conversion of a spin-coated precursor such as polysilazane. A drain contact 660 of a silicide and a conductive metal stack is formed over a bottom surface of the substrate 520. In embodiments, the conductive metal of the drain contact 660 may include silver or gold.

FIG. 6B illustrates a cross-section of a power device 610B corresponding to the power device 510 of FIG. 5 after further processing according to another embodiment.

In the active regions 512A and 512B, the same structures are formed as described for the power device 610B of FIG. 6B. As in FIG. 6B, a drain contact 660 of conductive metal, such as copper, is formed over a bottom surface of the substrate 520.

In the areas outside the active regions 512A and 512B, portions of the epitaxial layer 522 adjacent to the active regions 512A and 512B are removed to form trenches 648.

In embodiments, top portions of the substrate 520 are also removed as part of forming the trenches 648. The oxide layer 650 is formed in the trenches 648 and over the portions of the epitaxial layer 522 that remain outside the active regions 512A and 512B. In embodiments, the oxide layer 650 is also formed over portions of the active regions 512A and 512B.

The deep portions of the oxide layer 650 adjacent to the active regions 512A and 512B in the power device 610B of FIG. 6B and the power device 610C of FIG. 6C may be used (possibly with other structures known in the related arts) to provide high-voltage termination for the cells in the active regions 512A and 512B.

In both the power device 610A of FIG. 6A and the power device 610B of FIG. 6B, the substrate 520 is retained outside the active regions 512A and 512B, and is contiguous with the portions of the substrate 520 that are inside the active regions 512A and 512B. Accordingly, current being carried by the portions of the substrate 520 inside the active regions 512A and 512B may spread to the portions of the substrate 520 outside the active regions 512A and 512B, reducing the series resistance of the power device. The effect is especially beneficial when the power device includes a Schottky barrier diode, as the substrate 520 makes a large contribution to the series resistance of SBDs.

Figure 7:
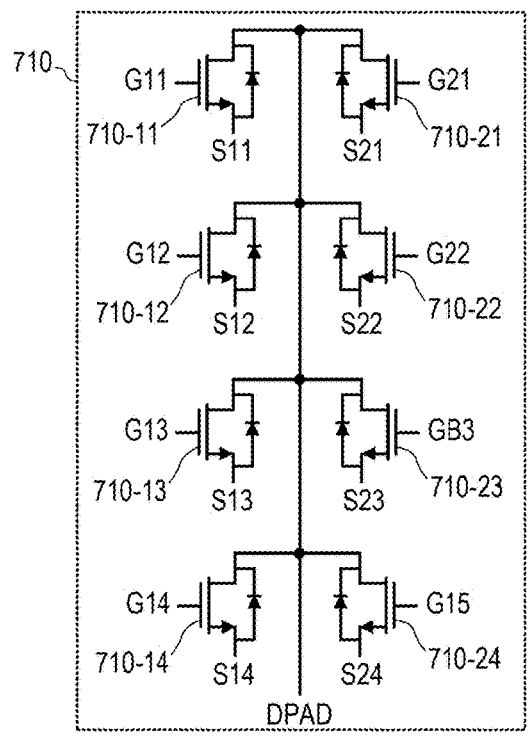
FIG. 7 illustrates a circuit corresponding to a VMOSFET power device according to an embodiment.

FIG. 7 illustrates a circuit corresponding to a VMOSFET power device 710 according to an embodiment. The VMOSFET power device 710 may correspond to the transistor 110 of FIG. 1.

The VMOSFET power device 710 includes first left active region 710-11 having a gate pad G11 connected to a gate of a respective MOSFET and a source pad S11 connected to a source of that MOSFET, and a first right active region 710-21 having a gate pad G21 connected to a gate of a respective MOSFET and a source pad S11 connected to a source of that MOSFET. The VMOSFET power device 710 further includes similarly-configured second left and right active regions 710-12 and 710-22 having respective gate pads G12 and G22 and source pads S12 and S22, third left and right active regions 710-13 and 710-23 having respective gate pads G13 and G23 and source pads S13 and S23, and fourth left and right active regions 710-14 and 710-24 having respective gate pads G14 and G24 and source pads S14 and S24. Drains of the MOSFETS in the active regions 710-11 through 710-24 are all connected to a drain contact DPAD which in embodiments may correspond to the drain contact 660 formed over the bottom of the VMOSFET power device 610B or 610C illustrated in FIG. 6B or 6C.

The VMOSFET power device 710 is illustrated as including eight active regions 710-11 through 710-24 each corresponding to a cell, and each cell is illustrated as including a MOSFET and corresponding diode, but embodiments are not limited thereto.

FIG. 8 illustrates a circuit corresponding to a driver device 808 according to an embodiment. The driver device 808 may correspond to the driver device 108 of FIG. 1.

The driver device 808 includes a first subdriver circuit 8081, a second subdriver circuit 8082, a third subdriver circuit 8083, and a fourth subdriver circuit 8084. The first, second, third, and fourth subdriver circuits 8081, 8082, 8083, and 8084 respectively include first, second, third, and fourth gate outputs GO1, GO2, GO3, and GO4 and first, second, third, and fourth Kelvin source connections KS1, KS2, KS3, and KS4. Inputs of the first, second, third, and fourth subdriver circuits 8081, 8082, 8083, and 8084 are all tied to an input terminal IN.

Power supply connections for the driver device 808 and the included subdriver circuits are not shown in the interest of clarity.

Figure 9A:
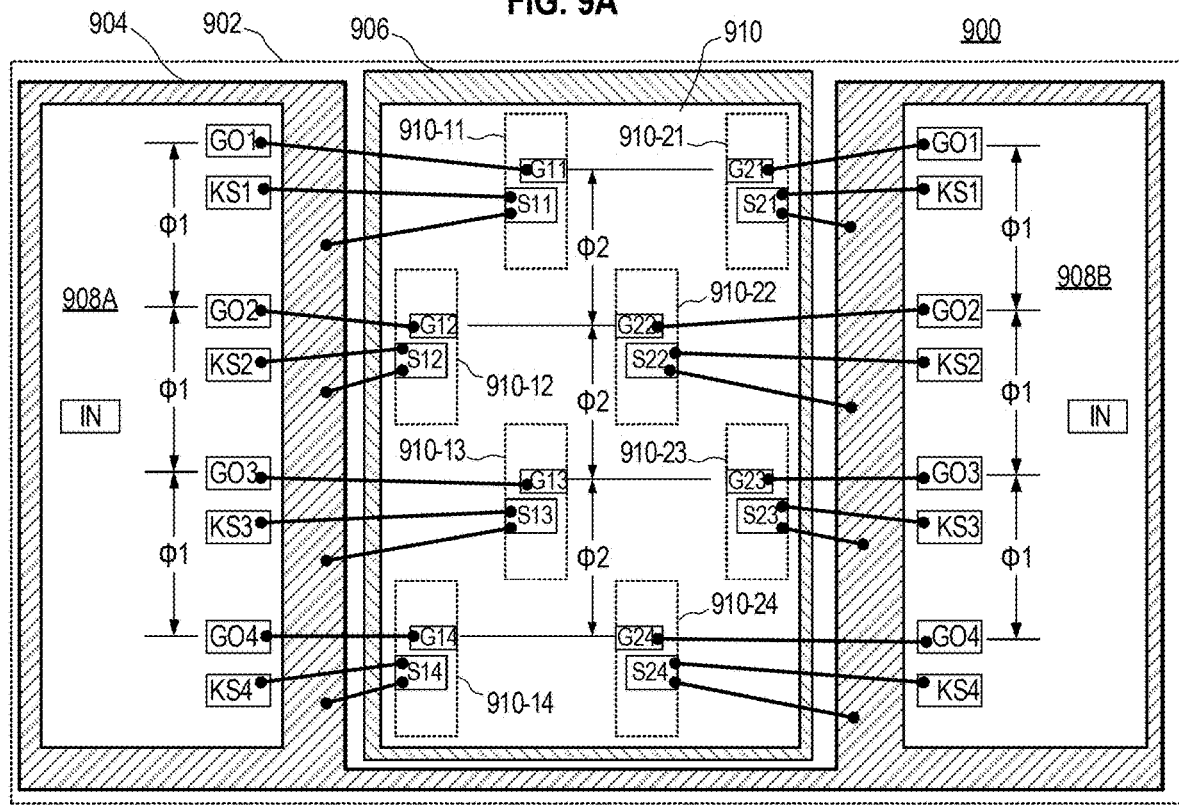
FIG. 9A illustrates a plan view of a circuit including two driver devices such as shown in FIG. 8 coupled to a VMOSFET power device according to an embodiment.

FIG. 9A illustrates a plan view of a circuit 900 including left and right driver devices 908A and 908B coupled to a VMOSFET power device 910 according to an embodiment. The left and right driver devices 908A and 908B may each include electrical circuitry corresponding to that shown for the driver device 808 of FIG. 8, and together may correspond to the driver device 108 of FIG. 1. The VMOSFET power device 910 may include electrical circuitry corresponding to that shown for the VMOSFET power device 710 of FIG. 7, and may correspond to the transistor 110 of FIG. 1.

First, second, third, and fourth left gate pads G11, G12, G13, and G14 respectively corresponding to first, second, third, and fourth left active regions 910-11, 910-12, 910-13, and 910-14 of the VMOSFET power device 910 are respectively connected (for example, by bond wires) to first, second, third, and fourth gate outputs GO1, GO2, GO3, and GO4 of the left driver device 908A. First, second, third, and fourth left source pads S11, S12, S13, and S14 respectively corresponding to the first, second, third, and fourth left active regions 910-11, 910-12, 910-13, and 910-14 of the VMOSFET power device 910 are respectively electrically connected (for example, by bond wires) to first, second, third, and fourth Kelvin source connections KS1, KS2, KS3, and KS4 of the left driver device 908A. The first, second, third, and fourth left source pads S11, S12, S13, and S14 are also electrically connected (for example, by bond wires) to a source pad 904.

First, second, third, and fourth right gate pads G21, G22, G23, and G24 respectively corresponding to first, second, third, and fourth right active regions 910-21, 910-22, 910-23, and 910-24 of the VMOSFET power device 910 are respectively connected (for example, by bond wires) to first, second, third, and fourth gate outputs GO1, GO2, GO3, and GO4 of the right driver device 908B. First, second, third, and fourth right source pads S21, S22, S23, and S24 respectively corresponding to the first, second, third, and fourth right active regions 910-21, 910-22, 910-23, and 910-24 of the VMOSFET power device 910 are respectively electrically connected (for example, by bond wires) to first, second, third, and fourth Kelvin source connections KS1, KS2, KS3, and KS4 of the right driver device 908B. The first, second, third, and fourth left source pads S11, S12, S13, and S14 are also electrically connected (for example, by bond wires) to the source pad 904.

For each of the left and right driver devices 908A and 908B, the Kelvin source wiring that connects the Kelvin source connections KS1 through KS4 to the corresponding source contacts S11 through S14 and S21 through S24 of the VMOSFET power device 910 provide additional isolation between the VMOSFET power device 910 and the left and right driver devices 908A and 908B, and the proximity of the connections between the gate outputs GO1 through GO4 and the gate contacts G11 through G14 and G21 through G24 of the VMOSFET power device 910 and the Kelvin source wiring forms a differential-mode low-impedance (that is, low inductance) path that aides in the suppression of the over- and under-voltages on the gates of the VMOSFET power device 910. Because the gates of the VMOSFET power device 910 are vulnerable to over- and under-voltages, suppression of the over- and under-voltages results in significant improvement in the reliability of the MOSFET. Thick bond wires are used to connect the source contacts S11 through S14 and S21 through S24 of the VMOSFET power device 910 to the source pad 904 disposed on the insulating layer 902 reduce source inductance of the VMOSFET power device 910. The distributed source contacts S11 through S14 and S21 through S24 further reduce the overall source inductance of the VMOSFET power device 910 for improved power capability.

A drain connection on the bottom of the VMOSFET power device 910 (not shown) is electrically connected to a drain pad 906. Power supply connections and connection to the input terminals of the left and right driver devices 908A and 908B are not shown in the interest of clarity.

The gate outputs GO1 through GO4 of each of the left and right driver devices 908A and 908B are vertically spaced according to a first pitch $\Phi 1$. The Kelvin source connections KS1 to KS4 of each of the left and right driver devices 908A and 908B may also be vertically spaced according to the first pitch $\Phi 1$.

The left gate pads G11 through G14 of the VMOSFET power device 910 are vertically spaced according to a second pitch $\Phi 2$. The right gate pads G21 through G24 are also vertically spaced according to the second pitch $\Phi 2$. The left source pads S11 through S14 may also be vertically spaced according to the second pitch $\Phi 2$, and the right source pads S21 through S24 may also be vertically spaced according to the second pitch $\Phi 2$.

The first pitch $\Phi 1$ may be the same or similar to the second pitch $\Phi 2$. For example, in an embodiment the first pitch $\Phi 1$ may be within 10% of the second pitch $\Phi 2$. In another embodiment, a distance between the upper-most and lower-most gate outputs of a driver device having N gate outputs vertically spaced according to the first pitch $\Phi 1$ i.e., $(N-1)\Phi 1$, may be greater than or equal to N-2 times the second pitch $\Phi 2$ and less than or equal to N times the second pitch $\Phi 2$, that is:

$$\frac{N-2}{N-1}\Phi 2 < \Phi 1 < \frac{N}{N-1}\Phi 2 \qquad \text{Equation 1A}$$

so that the driver devices 908A and 908B and the VMOSFET power device 910 may be positioned so that all gate outputs are vertically displaced no more than one-half the second pitch $\Phi 2$ from their corresponding gate pads. More generally, in an embodiment where the maximum allowable vertical displacement between the gate outputs and their corresponding gate pads is expressed as a fraction k of the second pitch $\Phi 2$, k greater than 0, the first pitch $\Phi 1$ satisfies:

$$\frac{N-1-2k}{N-1}\Phi 2 < \Phi 1 < \frac{N-1+2k}{N-1}\Phi 2 \qquad \text{Equation 1B}$$

Because a first pitch $\Phi 1$ is the same or close to a second pitch $\Phi 2$, variations between the respective lengths of the bond wires connecting the subdrivers of the left and right driver devices 908A and 908B to respective active regions of the VMOSFET power device 910 may be reduced, the length of the longest of those bond wires may be reduced, and accordingly parasitic inductances may be reduced and/or made more similar for each of the active regions.

Figure 9B:
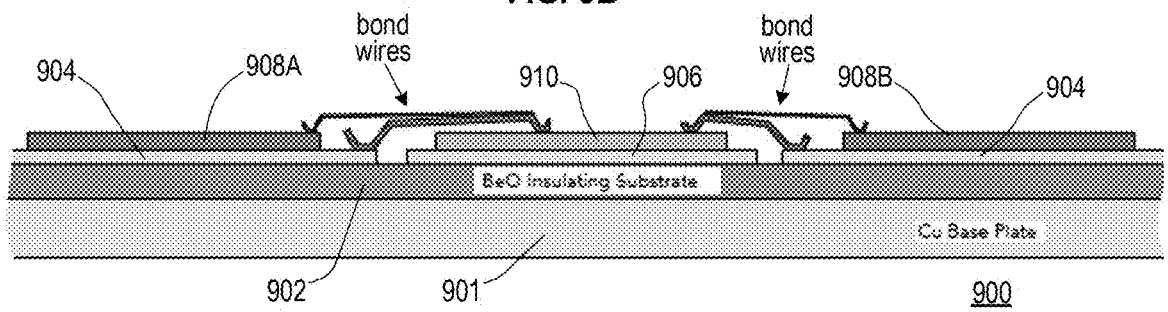
FIG. 9B illustrates a cross-section of the circuit including the two driver devices coupled to the VMOSFET power device shown in FIG. 9A according to an embodiment.

FIG. 9B illustrates a cross-section of a circuit including the left and right driver devices 908A and 908B coupled to the VMOSFET power device 910 shown in FIG. 9A according to an embodiment.

The left and right driver devices 908A and 908B are mounted over the source pad 904, and the VMOSFET power device 910 is mounted over the drain pad 906. The source pad 904 and the drain pad 906 are disposed on an electrically insulating layer 902. In the illustrated embodiment, the electrically insulating layer 902 comprises beryllium oxide, which has a high thermal conductivity, but embodiments are not limited thereto.

The electrically insulating layer 902 may be disposed on a base plate 901 having high electrical and thermal conductivity. In the illustrated embodiment, the base plate 901 comprises copper, but embodiments are not limited thereto.

Accordingly, in a circuit including a driver device having a plurality of gate outputs and a MOSFET comprised of a plurality of active regions each with its own gate pad, embodiments may minimize the parasitic inductances of the connections between the gate outputs and the gate pads and minimize the variation in those parasitic inductances by determining a pitch of the gate outputs according to a pitch of the gate pads or by determining the pitch of the gate pads according to the pitch of the gate outputs. Similarly, in embodiments, a pitch of Kelvin source connections of the driver device may be determined according to a pitch of source pads of the MOSFET, or vice versa, in order to minimize the parasitic inductances of the connections between the Kelvin source connections and the source pads and minimize the variation in those parasitic inductances.

Figure 10:
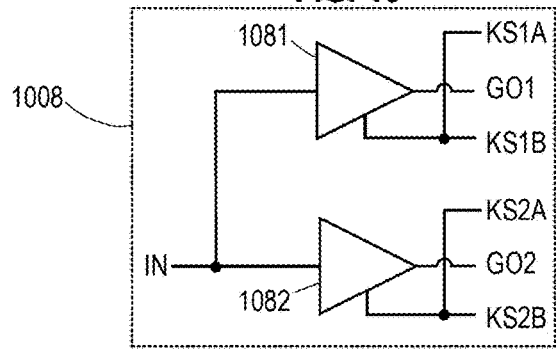
FIG. 10 illustrates a circuit corresponding to a driver device according to another embodiment.

FIG. 10 illustrates a circuit corresponding to a driver device 1008 according to another embodiment. The driver device 1008 may correspond to the driver device 108 of FIG. 1. The driver device 1008 may be adapted to driving two gate pads of a multi-gate power transistor from each of its gate outputs GO1 and GO2, as shall be explained with reference to FIG. 11.

The driver device 1008 includes first and second subdrivers 1081 and 1082 respectively having first and second gate outputs GO1 and GO2. The first subdriver 1081 has first and second Kelvin source connections KS1A and KS1B, and the second subdriver 1082 has third and fourth Kelvin source connections KS2A and KS2B. Inputs of the first and second subdrivers 1081 and 1082 are commonly coupled to an input terminal IN.

Figure 11:
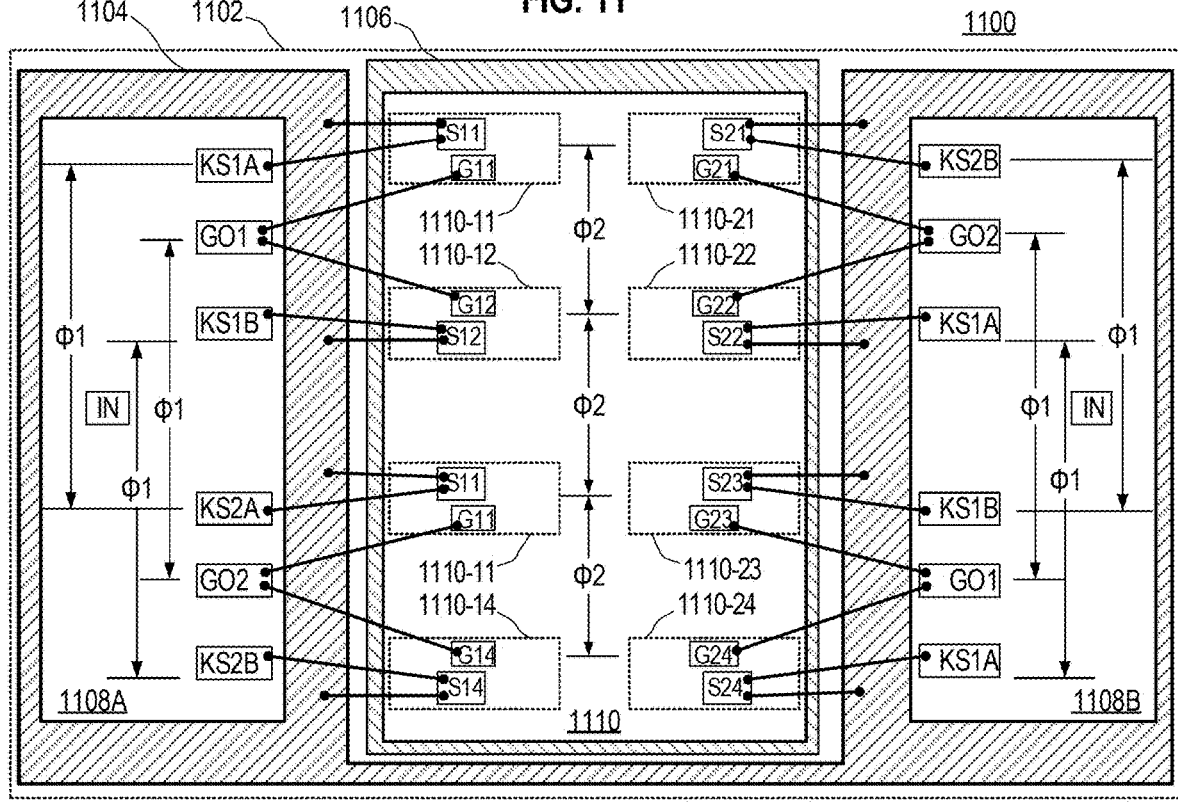
FIG. 11 illustrates a plan view of a circuit including two driver devices such as shown in FIG. 10 coupled to a VMOSFET power device according to another embodiment.

FIG. 11 illustrates a plan view of a circuit 1100 including left and right driver devices 1108A and 1108B such as shown in FIG. 10 coupled to a VMOSFET power device 1110 according to another embodiment.

In the circuit 1100, pairs of gate pads on the VMOSFET power device 1110 are connected to respective gate outputs of the driver devices 1108A and 1108B, but every source pad of the VMOSFET power device 1110 has a corresponding Kelvin source connection on one of the driver devices 1108A and 1108B.

Circuit 1100 differs from circuit 900 of FIG. 9 in the layout of first, second, third, and fourth left active regions 1110-11, 1110-12, 1110-13, and 1110-14 and first, second, third, and fourth right active regions 1110-21, 1110-22, 1110-23, and 1110-24, and in that each gate output of the left and right driver devices 1108A and 1108B is coupled to two gate pads of the VMOSFET power device 1110. The gate outputs and Kelvin source connections are vertically disposed according to the first pitch Φ1 so as to produce short, consistent bond wire lengths and geometries for the connections between the gate outputs and Kelvin source connections.

Accordingly, when there are N gate outputs total, there are up to twice as many (2N) gate pads, and the first pitch Φ1 is equal or close to twice the second pitch Φ2. In an embodiment where the maximum allowable vertical displacement between gate outputs and corresponding gate pads is expressed as a fraction k of the second pitch Φ2, the first pitch Φ1 satisfies:

$$\frac{2N-2-k}{N-1}\Phi2 < \Phi1 < \frac{2N-2+k}{N-1}\Phi2 \qquad \text{Equation 2}$$

With the first pitch Φ1 corresponding in this manner to the second pitch Φ2, the circuit 1100 provides short, consistent bond wire lengths and geometries for the connections between the left and right driver devices 1108A and 1108B and the VMOSFET power device 1110. This tends to minimize both the parasitic inductance of the bond wires and variations in the parasitic inductances between the bond wires.

The multiple source contacts, multiple gate contacts, matched connection topologies, and other features common between the circuit 1100 and the circuit 900 of FIGS. 9A and 9B may provide improved operational characteristics for the circuit 1100 such as were described for the circuit 900, above.

FIG. 12A illustrates a plan view of a circuit 1212 including first and second driver devices 1208A and 1208B and a VMOSFET power device 1210 according to an embodiment. The circuit 1212 further includes a source pad 1204 and a drain pad 1206.

The first and second driver devices 1208A and 1208B may each include electrical circuitry corresponding to that shown for the driver device 808 of FIG. 8, and together may correspond to the driver device 108 of FIG. 1. The VMOSFET power device 1210 may include electrical circuitry corresponding to that shown for the VMOSFET power device 710 of FIG. 7 and may correspond to the transistor 110 of FIG. 1.

The circuit 1212 differs from the circuit 900 of FIG. 9A in that striplines, ribbon bonding or the like (for example, photolithography-formed copper conductors deposited on polyimide) is used to connect the first and second driver devices 1208A and 1208B to the VMOSFET power device 1210 and to connect the VMOSFET power device 1210 to the source pad 1204.

Accordingly, first, second, third, and fourth left gate pads G11, G12, G13, and G14 of the VMOSFET power device 1210 are respectively connected (by respective striplines or traces) to first, second, third, and fourth gate outputs GO1, GO2, GO3, and GO4 of the first driver device 1208A. First, second, third, and fourth left source pads S11, S12, S13, and S14 are respectively electrically connected (by respective striplines or traces) to first, second, third, and fourth Kelvin source connections KS1, KS2, KS3, and KS4 of the first driver device 1208A (for example, a left Kelvin connection stripline 1222A that connects the fourth left source pad S14 to the fourth Kelvin source connection KS4 of the second driver device 1208B) and by different respective striplines or traces to source pad 1204 (for example, a left source pad stripline 1224A that connects the fourth left source pad S14 to the source pad 1204).

First, second, third, and fourth right gate pads G21, G22, G23, and G24 of the VMOSFET power device 1210 are respectively connected (by respective striplines or traces) to first, second, third, and fourth gate outputs GO1, GO2, GO3, and GO4 of the second driver device 1208B. First, second, third, and fourth right source pads S21, S22, S23, and S24 of the VMOSFET power device 1210 are respectively electrically connected by respective striplines or traces to first, second, third, and fourth Kelvin source connections KS1, KS2, KS3, and KS4 of the second driver device 1208B (for example, a right Kelvin connection stripline 1222B that connects the fourth right source pad S24 to the fourth Kelvin source connection KS4 of the second driver device 1208B) and by different respective striplines or traces to source pad 1204 (for example, a right source pad stripline 1224B that connects the fourth right source pad S24 to the source pad 1204).

A drain connection on the bottom of the VMOSFET power device 1210 (not shown) is electrically connected to a drain pad 1206. Power supply connections and connection to the input terminals of the first and second driver devices 1208A and 1208B are not shown in the interest of clarity.

The gate outputs GO1 through GO4 of each of the first and second driver devices 1208A and 1208B are vertically spaced according to a first pitch $\Phi 1$. The Kelvin source connections KS0 to KS4 of each of the first and second driver devices 1208A and 1208B may also be vertically spaced according to the first pitch $\Phi 1$.

The left gate pads G11 through G14 of the VMOSFET power device 1210 are vertically spaced according to a second pitch $\Phi 2$. The right gate pads G21 through G24 are also vertically spaced according to the second pitch $\Phi 2$. The left source pads S11 through S14 may also be vertically spaced according to the second pitch $\Phi 2$, and the right source pads S21 through S24 may also be vertically spaced according to the second pitch $\Phi 2$.

The first pitch $\Phi 1$ may be related to the second pitch $\Phi 2$ as described with respect to FIG. 9A, and accordingly the advantageous reduction in the magnitude and variation of the parasitic inductances of the connections between the first and second driver devices 1208A and 1208B and the VMOSFET power device 1210 may be realized, as described with respect to FIG. 9A.

Figure 12B:
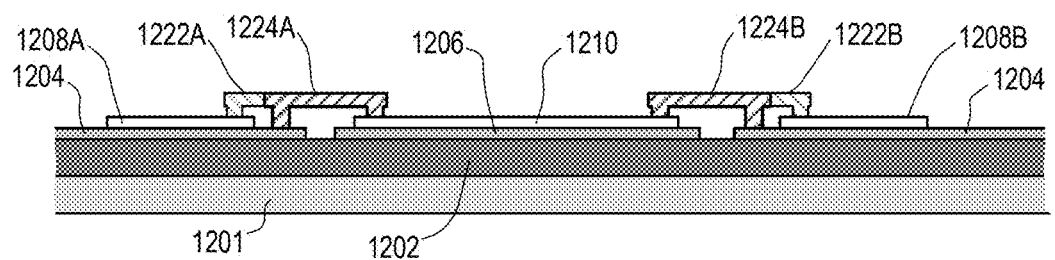
FIG. 12B illustrates a cross-section of the circuit including two driver devices coupled to the VMOSFET power device shown in FIG. 12A according to an embodiment.

FIG. 12B illustrates a cross-section of the first and second driver devices 1208A and 1208B coupled to the VMOSFET power device 1210 shown in FIG. 12A according to an embodiment.

The first and second driver devices 1208A and 1208B are mounted over the source pad 1204, and the VMOSFET power device 1210 is mounted over the drain pad 1206. The source pad 1204 and the drain pad 1206 are disposed on an electrically insulating layer 1202. In the illustrated embodiment, the electrically insulating layer 1202 comprises beryllium oxide, which has a high thermal conductivity, but embodiments are not limited thereto.

The electrically insulating layer 1202 may be disposed on a base plate 1201 having high electrical and thermal conductivity. In the illustrated embodiment, the base plate 1201 comprises copper, but embodiments are not limited thereto.

Striplines or traces and vias may be formed to electrically connect the first and second driver devices 1208A and 1208B, the VMOSFET power device 1210, and the source pad 1204, as described with respect to FIG. 12A. An insulating layer such as polyimide (not shown) may support the striplines or traces. Striplines or ribbon bonding may be used to connect the matched pads of the first and second driver devices 1208A and 1208B to the corresponding pads of the VMOSFET power device 1210.

The multiple source contacts, multiple gate contacts, matched connection topologies, and other features common between the circuit 1212 and the circuit 900 of FIGS. 9A and 9B may provide improved operational characteristics for the circuit 1212 such as were described for the circuit 900, above.

Figure 13:
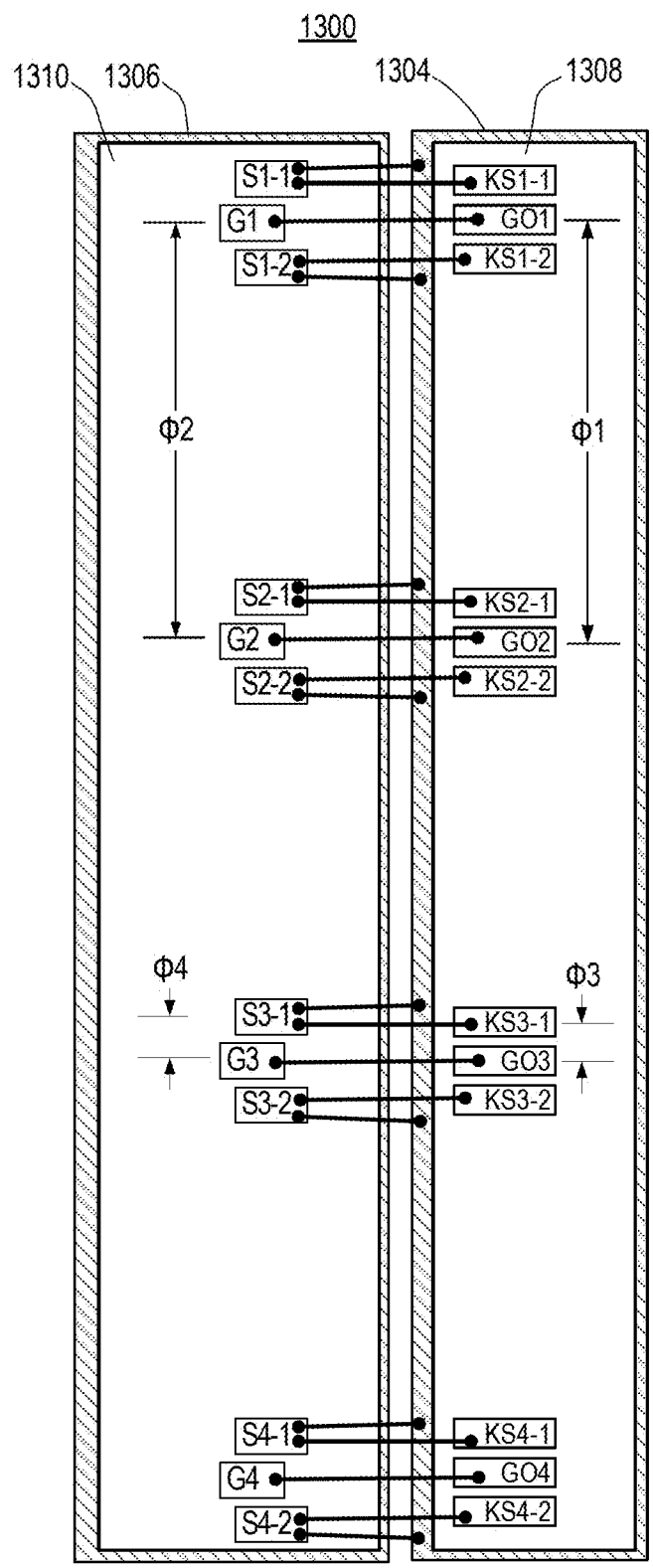
FIG. 13 illustrates a circuit including a VMOSFET power device according to an embodiment.

FIG. 13 illustrates a circuit 1300 including a VMOSFET power device 1310 and a corresponding driver device 1308 according to an embodiment.

The VMOSFET power device 1310 includes four active regions. Within the VMOSFET power device 1310, the first, second, third, and fourth gate pads G1, G2, G3, and G4 of the VMOSFET power device 1310 are electrically coupled to respective gate electrodes of first through fourth active regions (not shown); the first, second, third, and fourth upper source pads S1-1, S2-1, S3-1, and S4-1 are electrically coupled to respective upper source electrodes of the first through fourth active regions (not shown); and the first, second, third, and fourth lower source pads S1-2, S2-2, S3-2, and S4-2 are electrically coupled to respective lower source electrodes of the first through fourth active regions (not shown).

The driver device 1308 includes circuits similar to the driver device 1008 of FIG. 10 but with four subdriver circuits, each with a gate output and two Kelvin source connections. First, second, third, and fourth gate outputs GO1, GO2, GO3, and GO4 correspond to gate outputs of the respective first, second, third, and fourth subdriver circuits. First, second, third, and fourth upper Kelvin source connections KS1-1, KS2-1, KS3-1, and KS4-1 correspond to first Kelvin source connections of the respective first, second, third, and fourth subdriver circuits. First, second, third, and fourth lower Kelvin source connections KS1-2, KS2-2, KS3-2, and KS4-2 correspond to the second Kelvin source connections of the respective first, second, third, and fourth subdriver circuits.

The first through fourth gate pads G1 through G4 of the VMOSFET power device 1310 are electrically connected to the first through fourth gate outputs GO1 through GO4 of the driver device 1308. The first through fourth upper source pads S1-1 through S4-1 of the VMOSFET power device 1310 are electrically connected to the first through fourth upper Kelvin source connections KS1-1 through KS4-1 of the driver device 1308. The first through fourth lower source pads S1-2 through S4-2 of the VMOSFET power device 1310 are electrically connected to the first through fourth lower Kelvin source connections KS1-2 through KS4-2 of the driver device 1308. In the embodiment illustrated, the electrical connections are made using bond wires, but embodiments are not limited thereto.

The first, second, third, and fourth gate outputs GO1, GO2, GO3, and GO4 are spaced apart by a first pitch $\Phi 1$. The first, second, third, and fourth gate pads G1, G2, G3, and G4 are spaced apart by a second pitch $\Phi 2$. The first pitch $\Phi 1$ may be related to the second pitch $\Phi 2$ as described with respect to FIG. 9A, and accordingly the advantageous reduction in the magnitude and variation of the parasitic inductances of the connections between the driver device 1308 and the VMOSFET power device 1310 may be realized, as described with respect to FIG. 9A.

The upper and lower source Kelvin source connections may be separated from their respective gate outputs by a third pitch $\Phi 3$. The upper and lower source pads may be separated from their respective gate pads by a fourth pitch $\Phi 4$.

In an embodiment, the third pitch $\Phi 3$ may be substantially equal to the fourth pitch $\Phi 4$, so that the source bond wires between the Kelvin source connections on the driver device 1308 and their respective source pads on the VMOSFET power device 1310 may be kept to a substantially same length as the gate bond wires between the gate outputs and their respective gate pads.

In an embodiment, the third pitch Φ3 and the fourth pitch Φ4 are selected so that an angle of deviation α between the paths of the source bond wires and the paths of the gate bond wires (where angle of deviation α being 0 indicates that the source bond wires run parallel to the gate bond wires) is less than a predetermined amount. For example, the third pitch Φ3 and the fourth pitch Φ4 are selected so that an angle of deviation α is less than 15 degrees.

By determining the first, second, third, and fourth pitches Φ1, Φ2, Φ3, Φ4 as described above, the advantageous reduction in the magnitude and variation of the parasitic inductances of the connections between the driver device 1308 and the VMOSFET power device 1310 may be realized, as described with respect to FIG. 9A.

FIG. 14A illustrates a surface temperature map of a VMOSFET power device according to an embodiment, where the VMOSFET power device has a distribution of active regions similar to that shown in FIG. 3A (but with six more rows of active regions). FIG. 14B illustrates a cross-sectional temperature map of the VMOSFET power device.

As can be seen in FIGS. 14A and 14B, the temperature at the bottom of the die of the VMOSFET power device is substantially uniform. This allows full utilization of the heat transfer properties of the beryllium oxide and copper header that the VMOSFET power device is mounted over.

Figure 15:
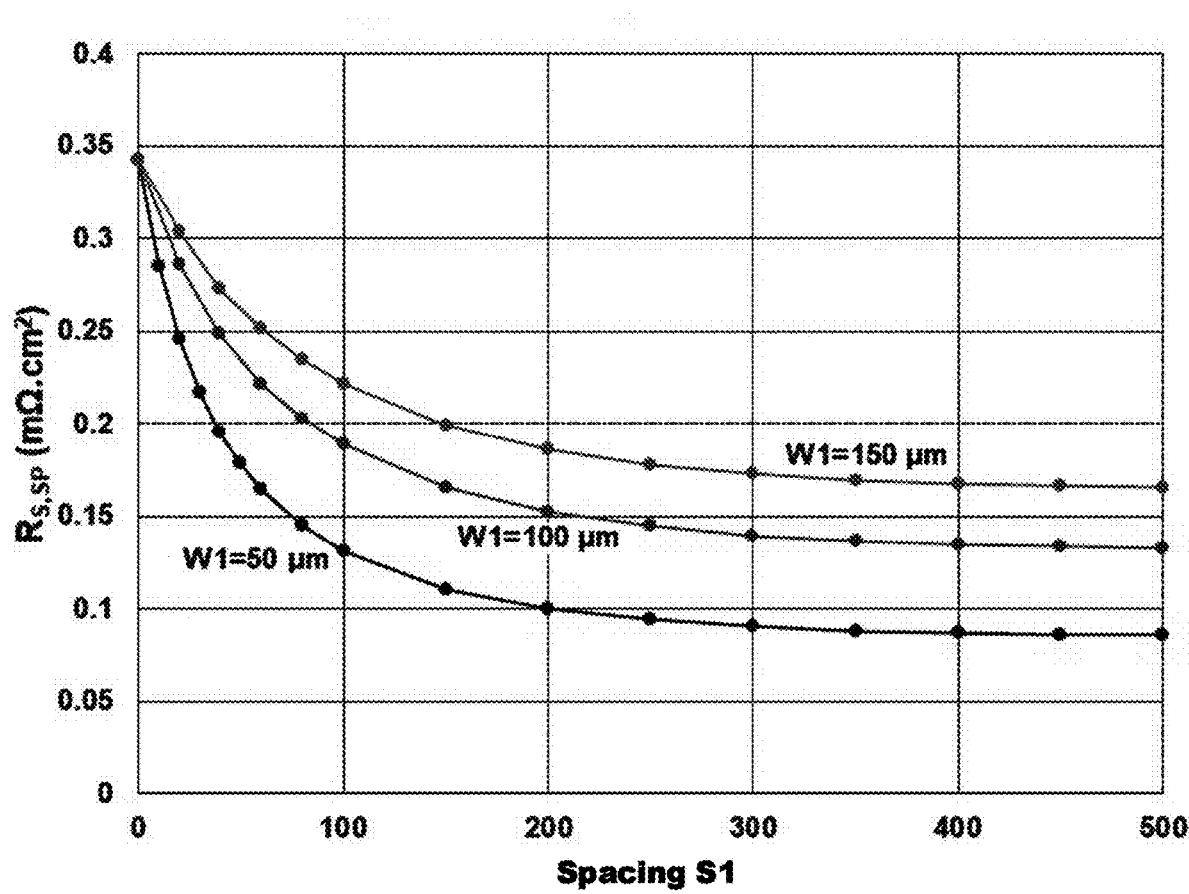
FIG. 15 is a graph of the series resistance of a device having an active region layout according to an embodiment.

FIG. 15 is a graph of the contribution from the substrate of a vertical device (such as a VMOSFET or vertical Schottky barrier diode) having an active region layout according to an embodiment to the specific series resistance $R_{S,SP}$ of the vertical device. Plots are shown for three widths W1 of the active regions (corresponding to, for example, the width w1 of FIG. 3A) according to a spacing S1 between the active regions (corresponding to, for example, the spacing s1 of FIG. 3A).

As shown in FIG. 15, the specific series resistance $R_{S,SP}$ decreases with increasing spacing S1 between the active regions. The decrease is caused by current spreading in the portions of the substrate of the device that are beneath the inactive regions and corresponds to a decrease in the on-state resistance of the device.

The decrease in the specific series resistance $R_{S,SP}$ with increasing spacing S1 is more marked when the active regions have a smaller width W1; that is, for narrower active regions. The effect of this current spreading in the substrate on the on-state resistance of a vertical Schottky barrier diode may be especially pronounced, as the substrate may account for up to 80% of the total on resistance of the vertical Schottky barrier diode.

Illustrative embodiments have been provided wherein a power device having a plurality of active regions each with respective gate contacts and source contacts connected to gate outputs and Kelvin source connections of one or more device drivers using wire bonds or using striplines, but embodiments are not limited thereto. For example, in embodiments, the gate contacts and source contacts of the power device may be connected to corresponding gate contacts and Kelvin source contacts of one or more driver devices using wire bonds, stripline, flip-chip technology, through-silicon vias, or combinations thereof.

Aspects of the present disclosure have been described in conjunction with the specific embodiments that are presented as illustrative examples. Numerous alternatives, modifications, and variations to the disclosed embodiments may be made without departing from the scope of the claims set forth below. Embodiments disclosed herein are not intended to be limiting.

What is claimed is:

1. A semiconductor device having a first surface and a second surface opposite the first surface, the semiconductor device comprising:
   a substrate;
   an epitaxial layer formed over the substrate;
   a plurality of active regions disposed over the substrate and formed in the epitaxial layer, the plurality of active regions having a first total area; and
   a plurality of cells of an active device comprising a silicon carbide Metal-Oxide-Semiconductor Field Effect Transistor, the plurality of cells respectively disposed in the plurality of active regions;
   a plurality of control pads disposed over the first surface and respectively electrically coupled to gate electrodes of the plurality of cells;
   a plurality of source pads disposed over the first surface and respectively electrically coupled to source electrodes of the plurality of cells;
   a drain contact disposed over the second surface and electrically coupled to drain electrodes of the plurality of cells;
   one or more inactive regions disposed over the substrate and between respective pairs of the active regions, the one or more inactive regions having a second total area,
   wherein the second total area is greater than or equal to 1.5 times the first total area,
   wherein a first half of the plurality of control pads are disposed along a first side of the semiconductor device,
   wherein a second half of the plurality of control pads are disposed along a second side of the semiconductor device, and
   wherein the first side is on an opposite side of the semiconductor device of the second side.

2. The semiconductor device of claim 1, wherein each of the control pads is disposed within the active region corresponding to the cell it is electrically coupled to.

3. The semiconductor device of claim 1, wherein respective lengths of the active regions are three or less times longer than respective widths of the active regions.

4. The semiconductor device of claim 1, wherein each of the active regions is spaced apart from the other active regions by at least a spacing that is greater than a combined thickness of the substrate and the epitaxial layer.

5. A semiconductor device having a first surface and a second surface opposite the first surface, the semiconductor device comprising:
   a substrate;
   an epitaxial layer formed over the substrate;
   a plurality of active regions disposed over the substrate and formed in the epitaxial layer, the plurality of active regions having a first total area; and
   a plurality of cells of an active device comprising a silicon carbide Metal-Oxide-Semiconductor Field Effect Transistor, the plurality of cells respectively disposed in the plurality of active regions;
   a plurality of control pads disposed over the first surface and respectively electrically coupled to gate electrodes of the plurality of cells;
   a plurality of source pads disposed over the first surface and respectively electrically coupled to source electrodes of the plurality of cells;
   a drain contact disposed over the second surface and electrically coupled to drain electrodes of the plurality of cells;
   one or more inactive regions disposed over the substrate and between respective pairs of the active regions, the one or more inactive regions having a second total area, wherein the second total area is greater than or equal to 1.5 times the first total area, wherein the active regions are disposed in a plurality of rows and a plurality of columns, and wherein a first active region in a first row of the plurality of rows is offset in a direction along the row from a second active region in a second row of the plurality of rows by an amount different from the center-to-center distance between adjacent active regions in the first row, the second row being adjacent to the first row.

6. The semiconductor device of claim 1, further comprising a plurality of high-voltage terminations respectively disposed along peripheries of the active regions.

7. The semiconductor device of claim 6, further comprising:
wherein each of the active regions is bordered by a respective one of the high-voltage terminations comprising an insulating material, and
wherein each of the high-voltage terminations is disposed through part of a depth of the epitaxial layer.

8. The semiconductor device of claim 7, wherein the each of the high-voltage terminations is disposed through all of the depth of the epitaxial layer and part way into a depth of the substrate.

9. A semiconductor device having a first surface and a second surface opposite the first surface, the semiconductor device comprising:
a substrate;
an epitaxial layer formed over the substrate;
a plurality of active regions disposed over the substrate and formed in the epitaxial layer, the plurality of active regions having a first total area; and
a plurality of cells of an active device comprising a silicon carbide Metal-Oxide-Semiconductor Field Effect Transistor, the plurality of cells respectively disposed in the plurality of active regions;
a plurality of control pads disposed over the first surface and respectively electrically coupled to gate electrodes of the plurality of cells;
a plurality of source pads disposed over the first surface and respectively electrically coupled to source electrodes of the plurality of cells;
a drain contact disposed over the second surface and electrically coupled to drain electrodes of the plurality of cells;
one or more inactive regions disposed over the substrate and between respective pairs of the active regions, the one or more inactive regions having a second total area,
wherein the second total area is greater than or equal to 1.5 times the first total area, and
wherein the active regions are disposed over a plurality of respective substrate mesas having heights greater than portions of the substrate under the inactive regions.

10. The semiconductor device of claim 1, further comprising one or more deep trenches formed in the inactive regions, each deep trench disposed adjacent to at least one of the active regions.

11. The semiconductor device of claim 9, wherein each of the control pads is disposed within the active region corresponding to the cell it is electrically coupled to.

12. The semiconductor device of claim 9, wherein respective lengths of the active regions are three or less times longer than respective widths of the active regions.

13. The semiconductor device of claim 9, wherein each of the active regions is spaced apart from the other active regions by at least a spacing that is greater than a combined thickness of the substrate and the epitaxial layer.

14. The semiconductor device of claim 9, further comprising a plurality of high-voltage terminations respectively disposed along peripheries of the active regions.

15. The semiconductor device of claim 5, wherein each of the control pads is disposed within the active region corresponding to the cell it is electrically coupled to.

16. The semiconductor device of claim 5, wherein respective lengths of the active regions are three or less times longer than respective widths of the active regions.

17. The semiconductor device of claim 5, wherein each of the active regions is spaced apart from the other active regions by at least a spacing that is greater than a combined thickness of the substrate and the epitaxial layer.

18. The semiconductor device of claim 5, further comprising a plurality of high-voltage terminations respectively disposed along peripheries of the active regions.

* * * * *